(12) United States Patent
Park et al.

(10) Patent No.: US 9,985,033 B2
(45) Date of Patent: May 29, 2018

(54) SEMICONDUCTOR DEVICE INCLUDING CAPACITOR

(71) Applicant: Samsung Electronics Co., Ltd., Suwon-si, Gyeonggi-do (KR)

(72) Inventors: Taejin Park, Yongin-si (KR);
Kyung-Eun Kim, Seoul (KR);
Bong-Soo Kim, Yongin-si (KR);
Ki-hyung Nam, Yongin-si (KR);
Yoosang Hwang, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days. days.

(21) Appl. No.: 15/397,842

(22) Filed: Jan. 4, 2017

(65) Prior Publication Data
US 2017/0194328 A1   Jul. 6, 2017

(30) Foreign Application Priority Data
Jan. 6, 2016   (KR) .................. 10-2016-0001634

(51) Int. Cl.
*H01L 23/48*   (2006.01)
*H01L 27/108*   (2006.01)
*H01L 29/423*   (2006.01)

(52) U.S. Cl.
CPC .. *H01L 27/10811* (2013.01); *H01L 27/10814* (2013.01); *H01L 27/10847* (2013.01); *H01L 29/4238* (2013.01)

(58) Field of Classification Search
CPC ......... H01L 27/10811; H01L 27/10847; H01L 29/4238
See application file for complete search history.

(56) References Cited

U.S. PATENT DOCUMENTS

| | | | |
|---|---|---|---|
| 6,284,595 B1 * | 9/2001 | Kato | H01L 28/92 257/E21.02 |
| 7,449,739 B2 | 11/2008 | Heitmann et al. | |
| 7,692,957 B2 * | 4/2010 | Chang | H01L 27/2436 365/148 |
| 8,134,195 B2 | 3/2012 | Lee et al. | |
| 8,339,765 B2 | 12/2012 | Choi et al. | |
| 8,395,235 B2 | 3/2013 | Tsuchiya | |
| 8,580,648 B2 * | 11/2013 | Choi | H01G 4/33 257/308 |
| 8,614,498 B2 | 12/2013 | Park et al. | |
| 8,841,195 B2 | 9/2014 | Sun et al. | |
| 9,053,971 B2 | 6/2015 | Park et al. | |

(Continued)

FOREIGN PATENT DOCUMENTS

| | | |
|---|---|---|
| JP | 2011/233561 A | 11/2011 |
| KR | 2010/0119445 A | 11/2010 |

(Continued)

*Primary Examiner* — Nicholas Tobergte
(74) *Attorney, Agent, or Firm* — Harness, Dickey & Pierce, P.L.C.

(57) ABSTRACT

A semiconductor device including a capacitor is provided. The semiconductor device includes lower electrodes, each of which includes a first electrode and a second electrode stacked in a first direction. The second electrode has a pillar shape that has a bar-type cross section having a longitudinal axis when viewed from a cross-sectional view taken along a plane defined by second and third directions perpendicular to the first direction.

19 Claims, 29 Drawing Sheets

(56) References Cited

U.S. PATENT DOCUMENTS

| 9,111,953 B2 | 8/2015 | Park et al. |
|---|---|---|
| 2009/0087958 A1 | 4/2009 | Uchiyama |
| 2009/0140397 A1 | 6/2009 | Sukekawa |

FOREIGN PATENT DOCUMENTS

| KR | 2011/0078020 A | 7/2011 |
|---|---|---|
| KR | 10-1096450 B1 | 12/2011 |

\* cited by examiner

SEMICONDUCTOR DEVICE INCLUDING CAPACITOR

CROSS-REFERENCE TO RELATED APPLICATION

This U.S. non-provisional patent application claims priority under 35 U.S.C. § 119 from Korean Patent Application No. 10-2016-0001634, filed on Jan. 6, 2016, in the Korean Intellectual Property Office, the disclosure of which is hereby incorporated by reference in its entirety.

BACKGROUND

Some example embodiments of the inventive concepts relate to a semiconductor device and/or to a semiconductor device including a capacitor.

Semiconductor devices are widely used in the electronics industry because of their small sizes, multi-functional characteristics, and/or low manufacturing costs. However, as semiconductor devices are highly integrated, various problems have appeared. For example, widths and/or distances of patterns in semiconductor devices are reduced by the high integration density of the semiconductor devices while heights and/or aspect ratios of the patterns are increased by the high integration density. Thus, uniformity of deposition processes and/or etching processes of thin layers may deteriorate and may reduce reliability of the semiconductor devices.

SUMMARY

Some example embodiments of the inventive concepts may provide a semiconductor device including a capacitor that is capable of improving reliability and integration density.

In some example embodiments, a semiconductor device may include lower electrodes disposed on a substrate, each of the lower electrodes including a first electrode and a second electrode stacked in a first direction, a dielectric layer disposed on the lower electrodes, and an upper electrode disposed on the dielectric layer. The second electrode may have a pillar structure that has a bar-type cross section having a longitudinal axis when viewed from a cross-sectional view taken along a plane defined by second and third directions perpendicular to the first direction. It will be understood that the second and third directions may be perpendicular, or substantially perpendicular to the first direction, to account for manufacturing tolerances.

In some example embodiments, a semiconductor device may include lower electrodes disposed on a substrate, each of the lower electrodes having a pillar structure having a bar-type cross section having a longitudinal axis, a dielectric layer disposed on the lower electrodes, and an upper electrode disposed on the dielectric layer.

In another embodiment, a semiconductor device include at least one stacked structure, the stacked structure including a first electrode stacked on a second electrode on a substrate, the first and second electrodes having a longitudinal portion and a transverse portion, the longitudinal portion being smaller than the transverse portion, a dielectric layer on the first and second electrodes, and an upper electrode on the dielectric layer.

BRIEF DESCRIPTION OF THE DRAWINGS

The example inventive concepts will become more apparent in view of the attached drawings and accompanying detailed description.

FIGS. 3A to 10A are plan views illustrating a method of manufacturing a semiconductor device, according to some example embodiments of the inventive concepts.

FIGS. 3B to 10B are cross-sectional views taken along lines I-I' of FIGS. 3A to 10A, respectively.

DETAILED DESCRIPTION OF THE EMBODIMENTS

Figure 1A:
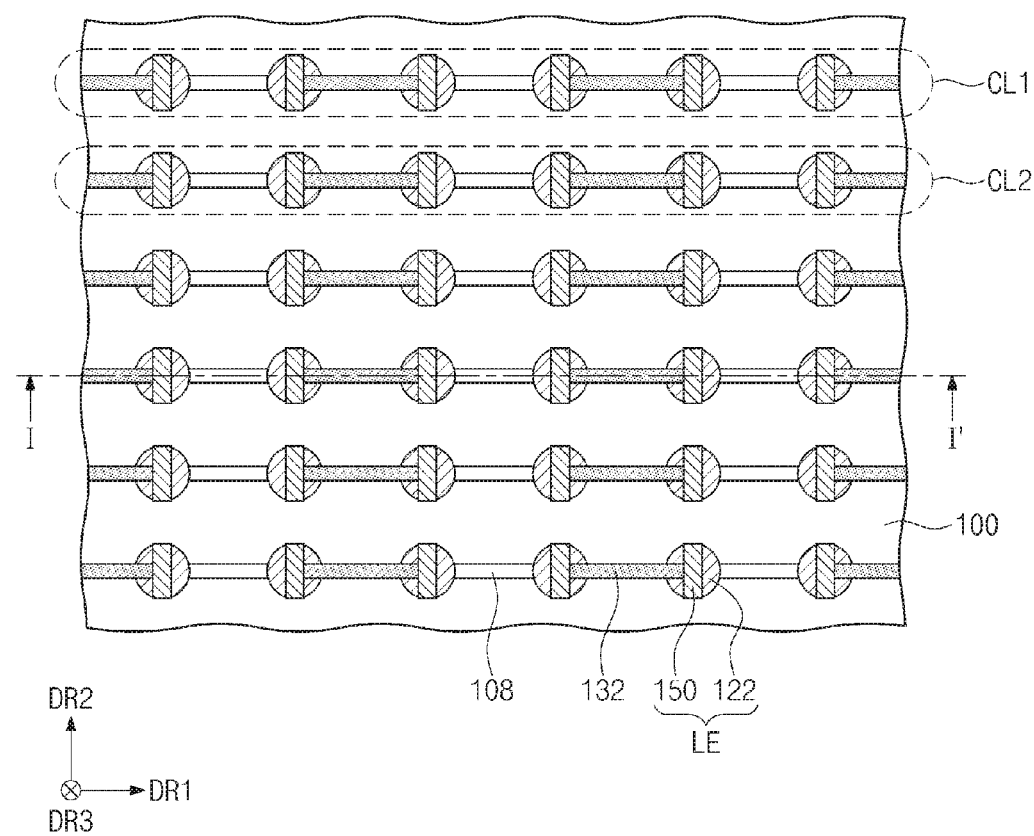
FIGS. 1A and 1B are plan views illustrating semiconductor devices according to some example embodiments of the inventive concepts.

These and other features and advantages are described in, or are apparent from, the following detailed description of various example embodiments.

Unless otherwise defined, all terms (including technical and scientific terms) used herein have the same meaning as commonly understood by one of ordinary skill in the art to which some example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein. As used herein, expressions such as "at least one of," when preceding a list of elements, modify the entire list of elements and do not modify the individual elements of the list.

Although corresponding plan views and/or perspective views of some cross-sectional view(s) may not be shown, the cross-sectional view(s) of device structures illustrated herein provide support for a plurality of device structures that extend along two different directions as would be illustrated in a plan view, and/or in three different directions as would be illustrated in a perspective view. The two different directions may or may not be orthogonal to each other. The three different directions may include a third direction that may be orthogonal to the two different directions. The plurality of device structures may be integrated in a same electronic device. For example, when a device structure (e.g., a memory cell structure or a transistor structure) is illustrated in a cross-sectional view, an electronic device may include a plurality of the device structures (e.g., memory cell structures or transistor structures), as would be illustrated by a plan view of the electronic device. The plurality of device structures may be arranged in an array and/or in a two-dimensional pattern.

Reference will now be made in detail to embodiments, examples of which are illustrated in the accompanying drawings, wherein like reference numerals refer to the like elements throughout. In this regard, the present embodiments may have different forms and should not be construed as being limited to the descriptions set forth herein. Accordingly, the embodiments are merely described below, by referring to the figures, to explain some example embodiments of the present description.

Figure 1B:
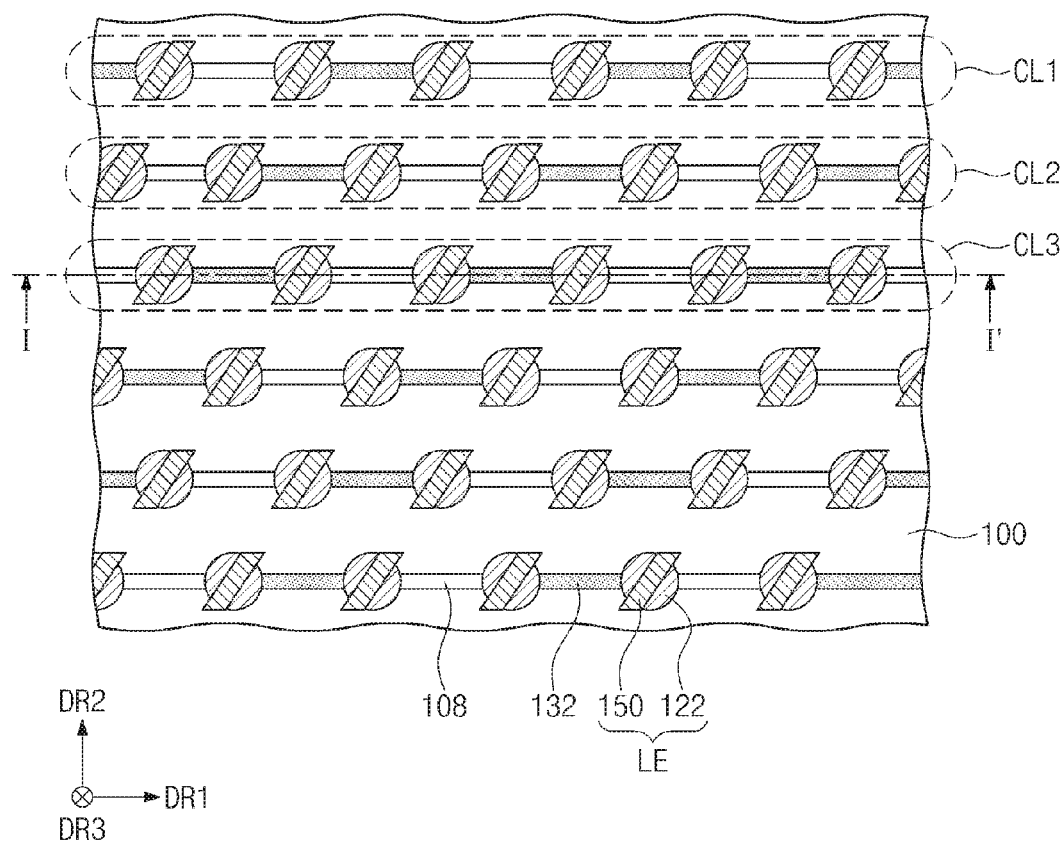
Figure 1C:
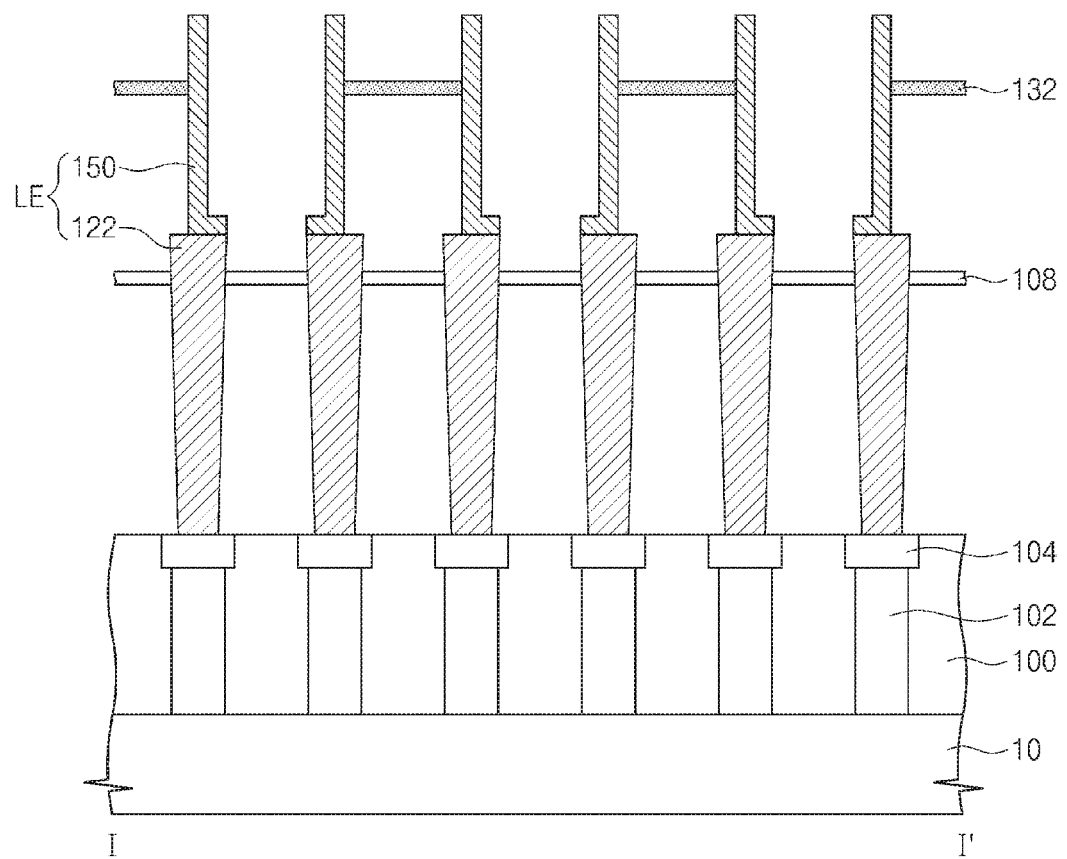
FIG. 1C is a cross-sectional view taken along a line I-I' of FIG. 1A or 1B.

FIGS. 1A and 1B are plan views illustrating semiconductor devices according to some example embodiments of the inventive concepts, and FIG. 1C is a cross-sectional view taken along a line I-I' of FIG. 1A or 1B.

Referring to FIGS. 1A to 1C, a semiconductor device may include a lower structure and one or more capacitors.

In some example embodiments, when the semiconductor device is a dynamic random access memory (DRAM) device, the lower structure may include transistors (not shown) and bit lines (not shown). The transistor may be a buried channel array transistor (BCAT), a fin-type transistor, or a planar transistor. The transistor may include a gate insulating layer (not shown), a gate electrode (not shown), and first and second dopant regions (not shown). The bit line may be electrically connected to the first dopant region through a first contact plug (not shown). The capacitors may be electrically connected to the second dopant regions of the transistors through second contact plugs 102, respectively. The second contact plugs 102 may penetrate an interlayer insulating layer 100 disposed on a substrate 10. In some example embodiments, a contact pad 104 may be disposed between each of the second contact plugs 102 and each of the capacitors. The capacitor may include a lower electrode LE, a dielectric layer (see 152 of FIG. 10B), and an upper electrode (see UE of FIG. 10B).

Referring to FIGS. 1A to 1C, the lower electrode LE of the capacitor may have a multi-layered structure. According to some example embodiments of the inventive concepts, the lower electrode LE of the capacitor may include a first electrode 122 and a second electrode 150. The first electrode 122 and the second electrode 150 may be stacked in a third direction DR3 perpendicular to a first direction DR1 and a second direction DR2. It will be understood that the third direction DR3 may be perpendicular, or substantially perpendicular to the first direction DR1, to account for manufacturing tolerances. The first electrode 122 may be in contact with and electrically connected to the second electrode 150. In some example embodiments, the lower electrode LE of the capacitor includes two stacked electrodes. However, the example embodiments of the inventive concepts are not limited thereto. In certain example embodiments, the lower electrode LE of the capacitor may include three or more stacked electrodes.

In some example embodiments, the first electrode 122 may have a cylindrical shape, and the second electrode 150 may have a bar shape having a longitudinal axis when viewed from a plan view. However, the example embodiments of the inventive concepts are not limited to these structures of the first and second electrodes 122 and 150. The structures of the first and second electrodes 122 and 150 will be described later in more detail.

A width of each of the second electrodes 150 of the lower electrodes LE may be smaller than a width of each of the first electrodes 122 of the lower electrodes LE. The second electrodes 150 may be arranged such that each of the second electrodes 150 covers at least a portion of each of the first electrodes 122. For example, each of the second electrodes 150 may be provided on a central portion of each of the first electrodes 122. The lower electrodes LE may be arranged in the first and second directions DR1 and DR2 in a plan view and may be spaced apart from each other.

According to some example embodiment illustrated in FIG. 1A, the lower electrodes LE may constitute groups, each of which includes the lower electrodes LE arranged in the first direction DR1. The groups may include a first group CL1 and a second group CL2 which are spaced apart from each other in the second direction DR2 perpendicular to the first direction DR1. The lower electrodes LE of the first group CL1 may be aligned with the lower electrodes LE of the second group CL2 in the second direction DR2, respectively. Thus, the lower electrodes LE of the first and second groups CL1 and CL2 may constitute a plurality of columns parallel to the second direction DR2. It will be understood that the plurality of columns may be parallel, or substantially parallel to the second direction DR2, to account for manufacturing tolerances. Meanwhile, each of the second electrodes 150 may have a longitudinal axis, and the long axes of the second electrodes 150 may be substantially parallel to the second direction DR2.

According to some example embodiment illustrated in FIG. 1B, the lower electrodes LE may constitute groups, each of which including the lower electrodes LE arranged in the first direction DR1. The groups may include a first group CL, a second group CL2, and a third group CL3 which are spaced apart from each other in the second direction DR2. The lower electrodes LE of the first group CL1 may be aligned with the lower electrodes LE of the third group CL3 in the second direction DR2, respectively. Thus, the lower electrodes LE of the first and third groups CL1 and CL3 may constitute a plurality of columns parallel to the second direction DR2. At this time, the lower electrodes LE of the second group CL2 may be laterally offset from the columns of the lower electrodes LE of the first and third groups CL1 and CL3, respectively. Meanwhile, each of the second electrodes 150 may have a longitudinal axis, and the long axes of the second electrodes 150 may be parallel to a direction that is non-parallel and non-perpendicular to the first and second directions DR1 and DR2 when viewed from a plan view.

Each of the first electrodes 122 may have an aspect ratio of about 1:10 or more. First support patterns 108 may be provided between the first electrodes 122 to prevent the first electrodes 122 having a high aspect ratio from leaning. Each of the first support patterns 108 may be connected between two first electrodes 122 adjacent to each other. In addition, each of the second electrodes 150 may also have an aspect ratio of about 1:10 or more. Second support patterns 132 may be provided between the second electrodes 150 to prevent the second electrodes 150 having a high aspect ratio from leaning. Each of the second support patterns 132 may be connected between two second electrodes 150 adjacent to each other.

In some example embodiments, each of the first and second electrodes 122 and 150 may have at least one of a cylindrical shape, a pillar shape having a bar-type horizontal cross section, or a hollow cylindrical shape. Hereinafter, structures of the first and second electrodes 122 and 150 will be described as examples.

FIGS. 2A to 2D are perspective views illustrating lower electrodes LE of capacitors according to some example embodiments of the inventive concepts.

Figure 2A:
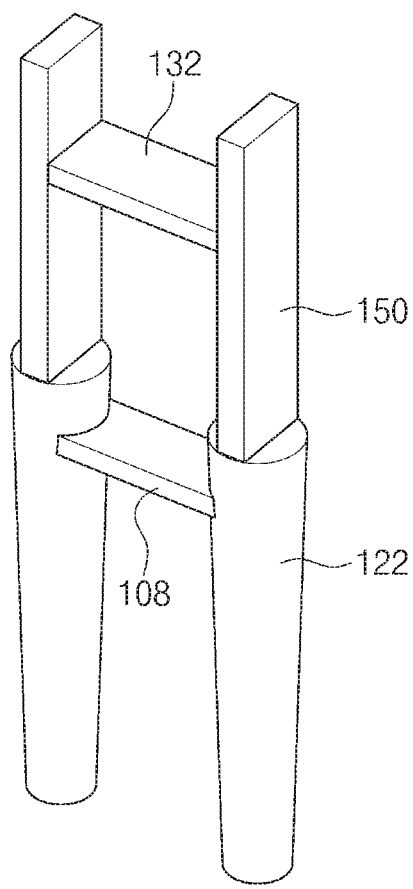
FIGS. 2A to 2D are perspective views illustrating lower electrodes of capacitors according to some example embodiments of the inventive concepts.

Referring to FIG. 2A, a second electrode 150 may be stacked on a first electrode 122 in the third direction DR3. The first electrode 122 may have a cylindrical shape. A diameter of the first electrode 122 may taper and become progressively smaller toward a bottom surface of the first electrode 122. The second electrode 150 may have a bar-type cross section when viewed from a cross-sectional view taken along a plane defined by the first and second directions DR1 and DR2 that are perpendicular to the third direction DR3. The bar-type cross section of the second electrode 150 may have a longitudinal axis direction that is parallel to the second direction DR2. The second electrode 150 may have a longitudinal axis in the second direction DR2 and a short axis in the first direction DR1. In FIG. 2A, the second electrode 150 may have a rectangular shape when viewed from a plan view. However, example embodiments of the inventive concepts are not limited thereto. In certain example embodiments, corners of the second electrode 150 may be rounded. In this case, the second electrode 150 may have an elliptical shape or a diamond shape having rounded corners when viewed from a plan view.

Figure 2B:
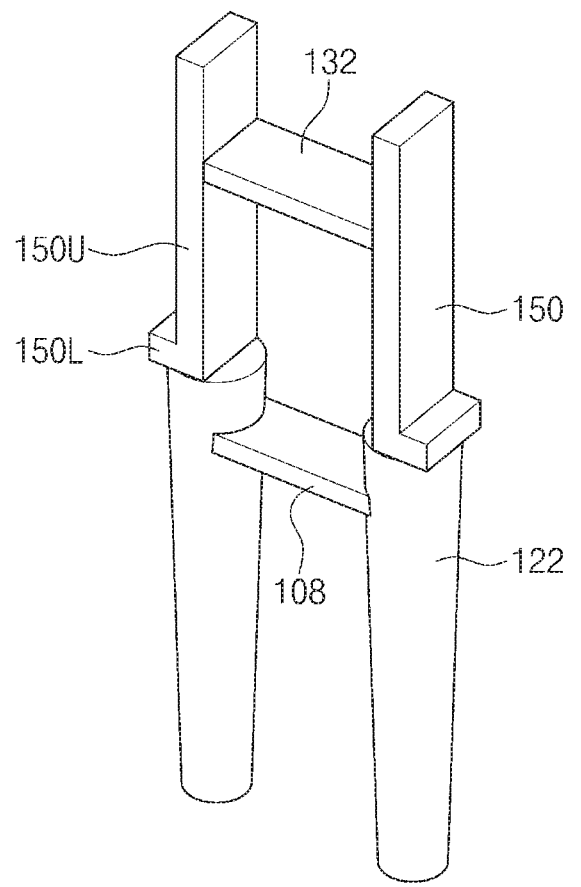

Referring to FIG. 2B, a first electrode 122 may have a cylindrical shape. A second electrode 150 may include an upper portion 150U having a pillar shape and having a bar-type (horizontal) cross section, and a lower portion 150L extending from a bottom end portion of the upper portion 150U in the first direction DR1. The second electrode 150 may have an L-shaped structure. In certain example embodiments, even though not shown in the drawings, the second electrode 150 may have an elliptical shape or a diamond shape having rounded corners when viewed from a plan view.

Figure 2C:
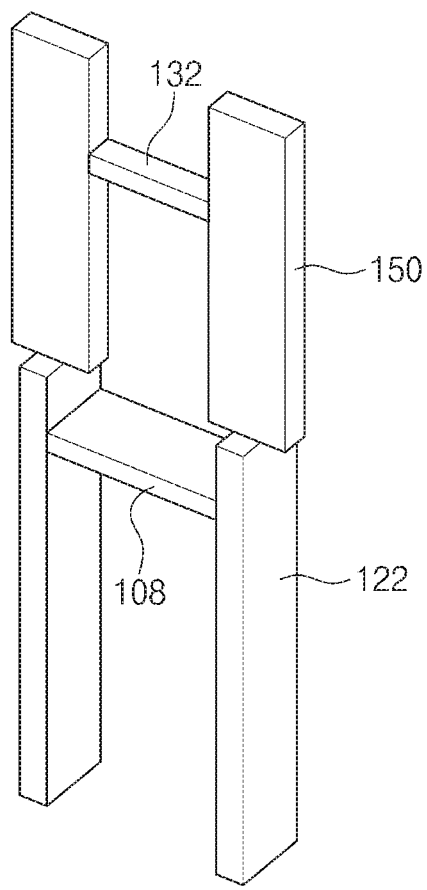

Referring to FIG. 2C, a first electrode 122 may have a pillar shape having a bar-type (horizontal) cross section of which a long-axis direction is parallel to the second direction DR2. A second electrode 150 may have a pillar shape having a bar-type (horizontal) cross section of which a long-axis direction is parallel to the first direction DR1 and perpendicular to the second direction DR2.

In certain example embodiments, even though not shown in the drawings, at least one of the first electrode 122 or the second electrode 150 may have an elliptical shape or a diamond shape having rounded corners when viewed from a plan view. In certain example embodiments, even though not shown in the drawings, at least one of the first electrode 122 or the second electrode 150 may have an L-shaped structure.

Figure 2D:
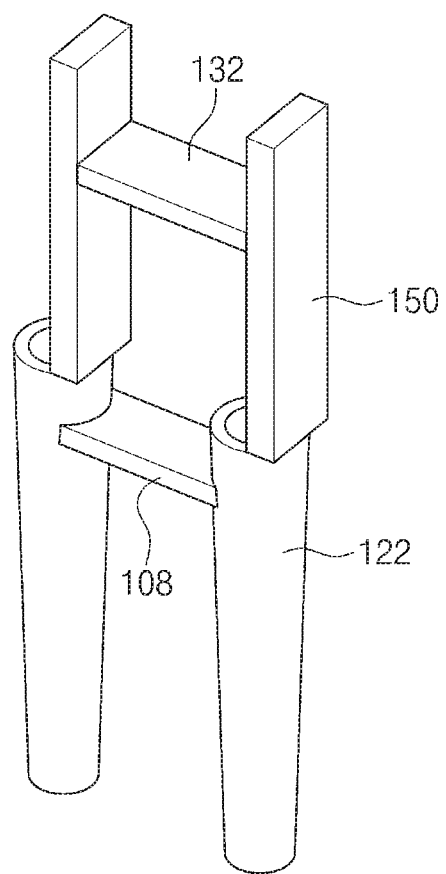

Referring to FIG. 2D, a first electrode 122 may have a hollow cylindrical structure of which a bottom end is closed. A diameter of the first electrode 122 may taper and become progressively smaller toward a bottom surface of the first electrode 122. A second electrode 150 may have a pillar shape having a bar-type (horizontal) cross section of which a long-axis direction is parallel to the first or second direction DR1 or DR2.

In certain example embodiments, even though not shown in the drawings, the second electrode 150 may have an elliptical shape or a diamond shape having rounded corners when viewed from a plan view. In certain example embodiments, even though not shown in the drawings, the second electrode 150 may have an L-shaped structure.

However, some example embodiments of the inventive concepts are not limited to the structures of the first and second electrodes 122 and 150 described with reference to FIGS. 2A to 2D.

FIGS. 3A to 10A are plan views illustrating a method of manufacturing a semiconductor device, according to some example embodiments of the inventive concepts. FIGS. 3B to 10B are cross-sectional views taken along lines I-I' of FIGS. 3A to 10A, respectively. FIGS. 7B to 7D are cross-sectional views illustrating a method of forming a semiconductor device of FIG. 7A.

Figure 3A:
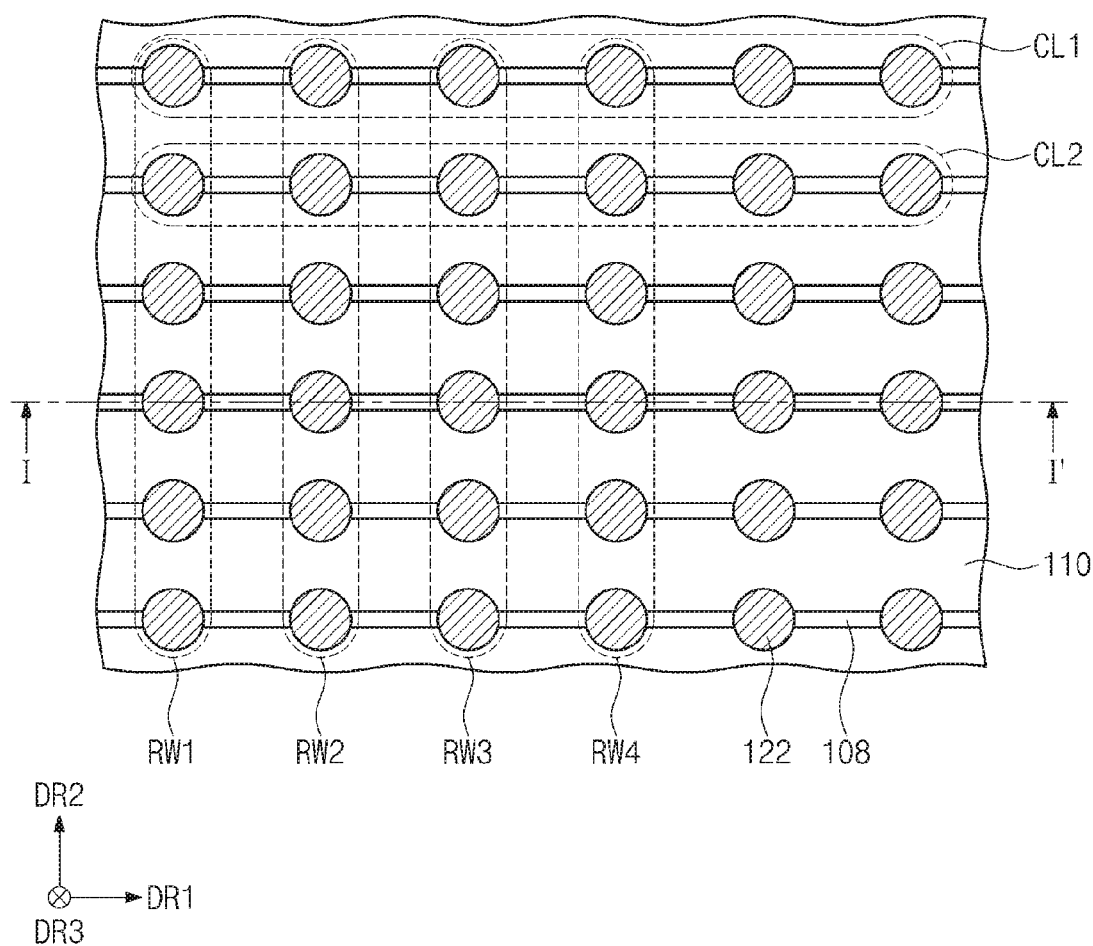
Figure 3B:
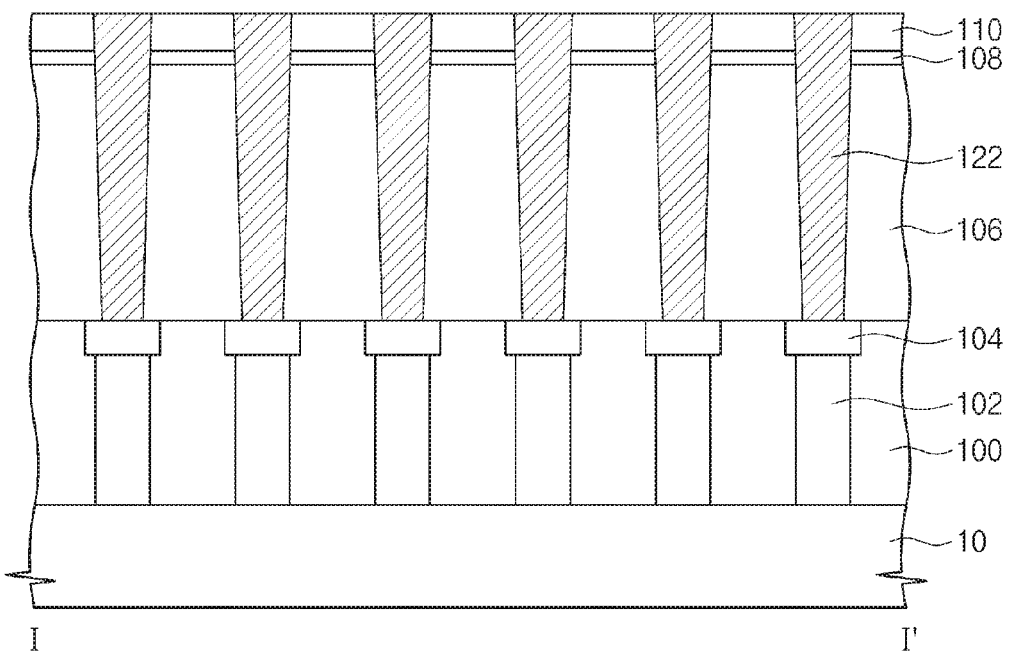
Figure 3B:
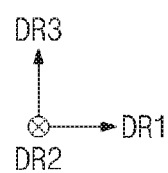

Referring to FIGS. 3A and 3B, a lower structure may be formed on a substrate 10, and then first electrodes 122 and first support patterns 108 may be formed on the lower structure. The first electrodes 122 may be electrically connected to the lower structure.

In some example embodiments, the lower structure may include contact plugs 102 and contact pads 104 which are formed in an interlayer insulating layer 100 formed on the substrate 10. Even though not shown in the drawings, each of the contact plugs 102 may be electrically connected to at least one of source/drain regions of a transistor (not shown).

A first sacrificial layer 106, the first support patterns 108, and a second sacrificial layer 110 may be formed, for example sequentially formed, on the interlayer insulating layer 100. In some example embodiments, a first support layer may be formed on the first sacrificial layer 106, and a patterning process may be performed on the first support layer to form the first support patterns 108. In some example embodiments, each of the first support patterns 108 may have a linear shape extending in a first direction DR1. The second sacrificial layer 110 may be formed on the first support patterns 108 and the first sacrificial layer 106. The first and second sacrificial layers 106 and 110 may include the same material and may include a material having an etch selectivity with respect to the first support patterns 108 in an etching process using an etchant. The first and second sacrificial layers 106 and 110 may include at least one of a spin-on-hardmask (SOH) material, a photoresist, an oxide, a nitride, or an oxynitride. The first support patterns 108 may include a nitride or an oxynitride.

The second sacrificial layer 110, the first support patterns 108, and the first sacrificial layer 106 may be patterned to form first holes which expose the contact pads 104, respectively. A first conductive layer may be formed on the second sacrificial layer 110 to fill the first holes. The first conductive layer may include at least one of doped poly-silicon, tungsten, titanium, tantalum, tungsten nitride, titanium nitride, or tantalum nitride. The first conductive layer may be planarized until a top surface of the second sacrificial layer 110 is exposed, thereby forming the first electrodes 122. In an example embodiment, each of the first electrodes 122 may have a cylindrical shape. However, some example embodiments of the inventive concepts are not limited thereto.

Referring to FIG. 3A, the first electrodes 122 may be spaced apart from each other and may be arranged in the first direction DR1 and the second direction DR2 to constitute row groups and column groups. The row groups may be parallel to the first direction DR1 and may include a first row group CL1 and a second row group CL2. The first electrodes 122 of the first row group CL1 may be aligned with the first electrodes 122 of the second row group CL2 in the second direction DR2, respectively. The column groups may be parallel to the second direction DR2 and may include a first column group RW1, a second column group RW2, a third column group RW3, and a fourth column group RW4. The first electrodes 122 of the first column group RW1 may be aligned with the first electrodes 122 of the second column group RW2, the first electrodes 122 of the third column group RW3, and the first electrodes 122 of the fourth column group RW4 in the first direction DR1, respectively.

Figure 4A:
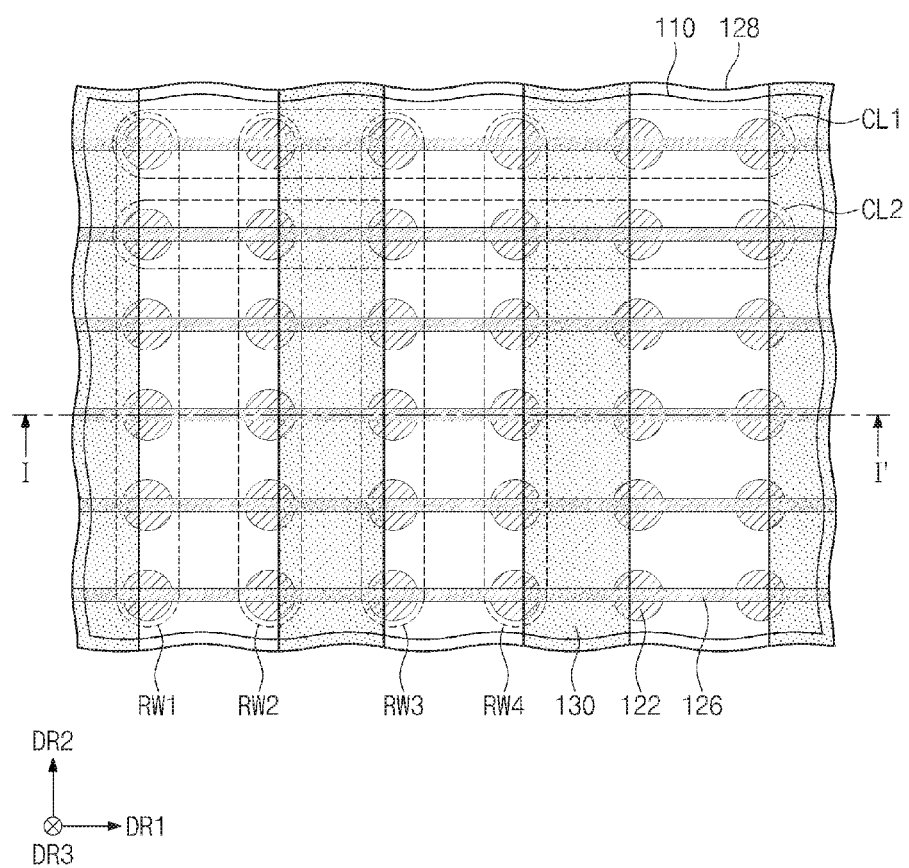
Figure 4B:
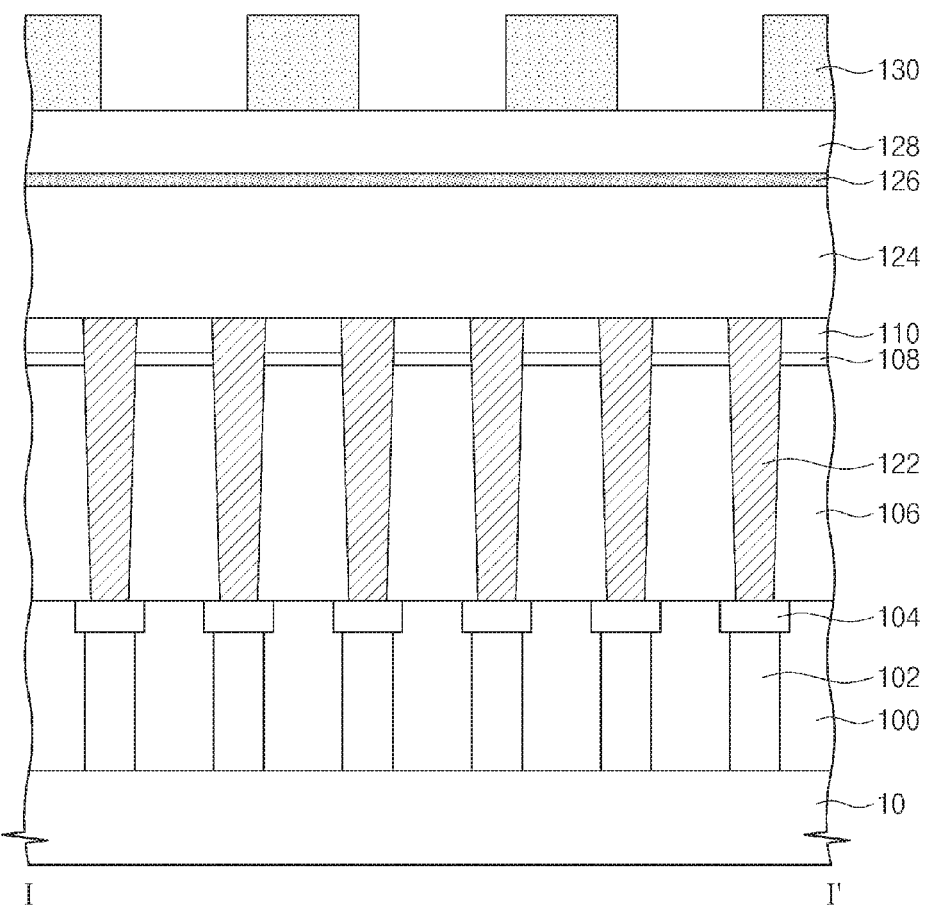
Figure 4B:
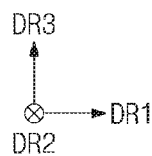

Referring to FIGS. 4A and 4B, a third sacrificial layer 124, a second support layer 126, and a fourth sacrificial layer 128 may be formed, for example sequentially formed, on the second sacrificial layer 110 and the first electrodes 122. The third and fourth sacrificial layers 124 and 128 may include the same material and may include a material having an etch selectivity with respect to the second support layer 126 in an etching process using an etchant. For example, the third and fourth sacrificial layers 124 and 128 may include at least one of a SOH material, a photoresist, an oxide, a nitride, or an oxynitride. The second support layer 126 may include a nitride or an oxynitride.

Next, first mask patterns 130 extending in the second direction DR2 may be formed on the fourth sacrificial layer 128. Each of the first mask patterns 130 may cover at least portions of the first electrodes 122 of two column groups adjacent to each other. For example, one of the first mask patterns 130 may cover at least portions of the first electrodes 122 of the second column group RW2 and at least portions of the first electrodes 122 of the third column group RW3. Another of the first mask patterns 130 may cover at least portions of the first electrodes 122 of the fourth column group RW4 and at least portions of the first electrodes 122 of a fifth column group disposed at a side of the fourth column group RW4.

Figure 5A:
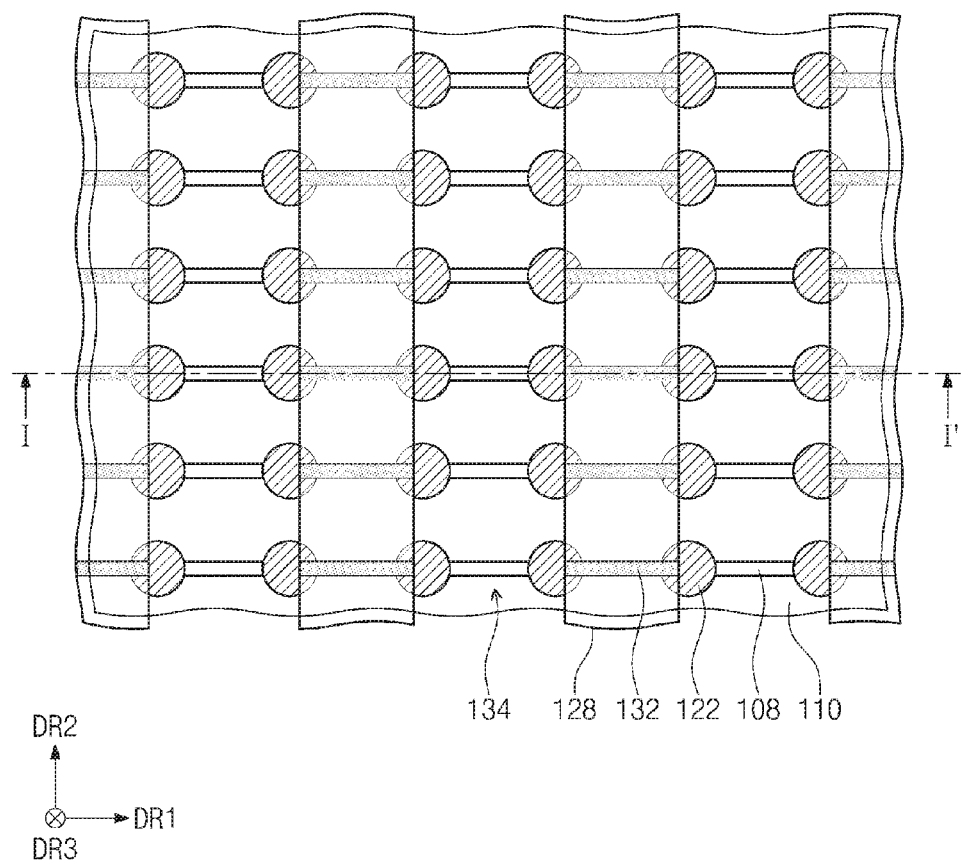
Figure 5B:
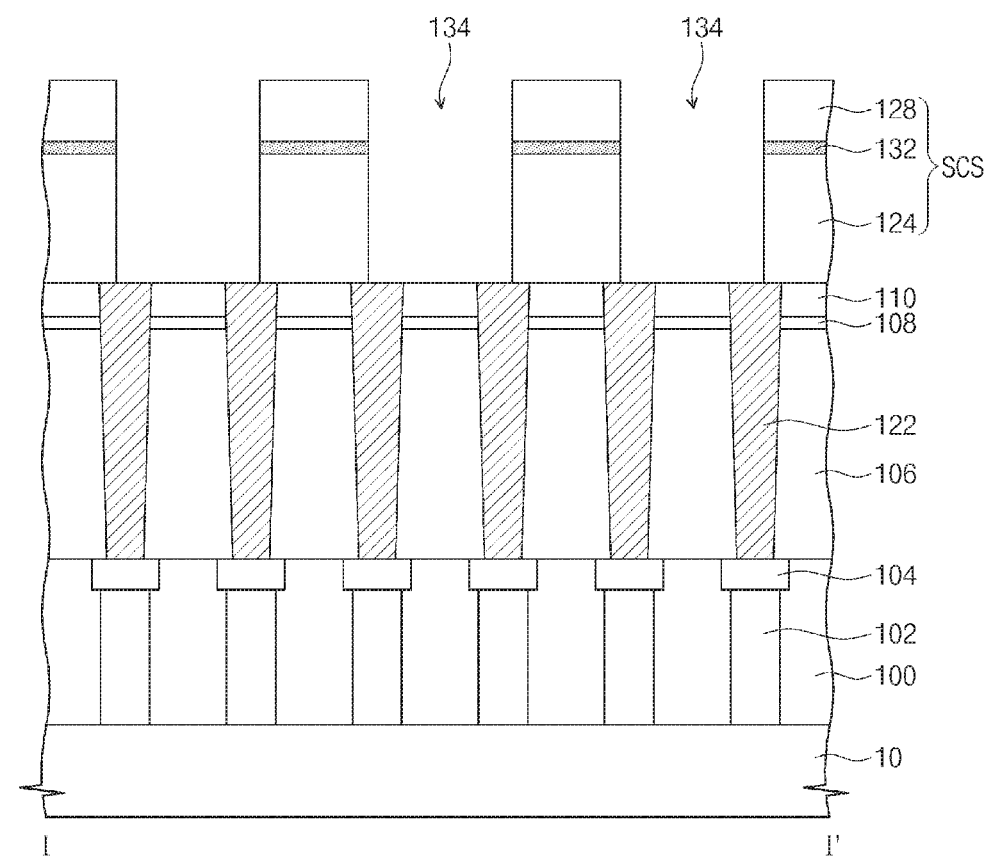

Referring to FIGS. 5A and 5B, the fourth sacrificial layer 128, the second support layer 126, and the third sacrificial layer 124 may be patterned using the first mask patterns 130 as etch masks to form openings 134 exposing a top surface of the second sacrificial layer 110 and at least portions of the first electrodes 122. The first mask patterns 130 may be removed after the etching process.

The second support layer 126 may be patterned by the etching process, and thus second support patterns 132 may be formed. The patterned third sacrificial layer 124, the second support patterns 132, and the patterned fourth sacrificial layer 128, which are sequentially stacked, are defined as a sacrificial structure SCS for the purpose of ease and convenience in explanation. A plurality of sacrificial structures SCS respectively corresponding to the first mask patterns 130 may be formed on the second sacrificial layer 110. Each or one of the openings 134 may be formed between two sacrificial structures SCS adjacent to each other.

Figure 6A:
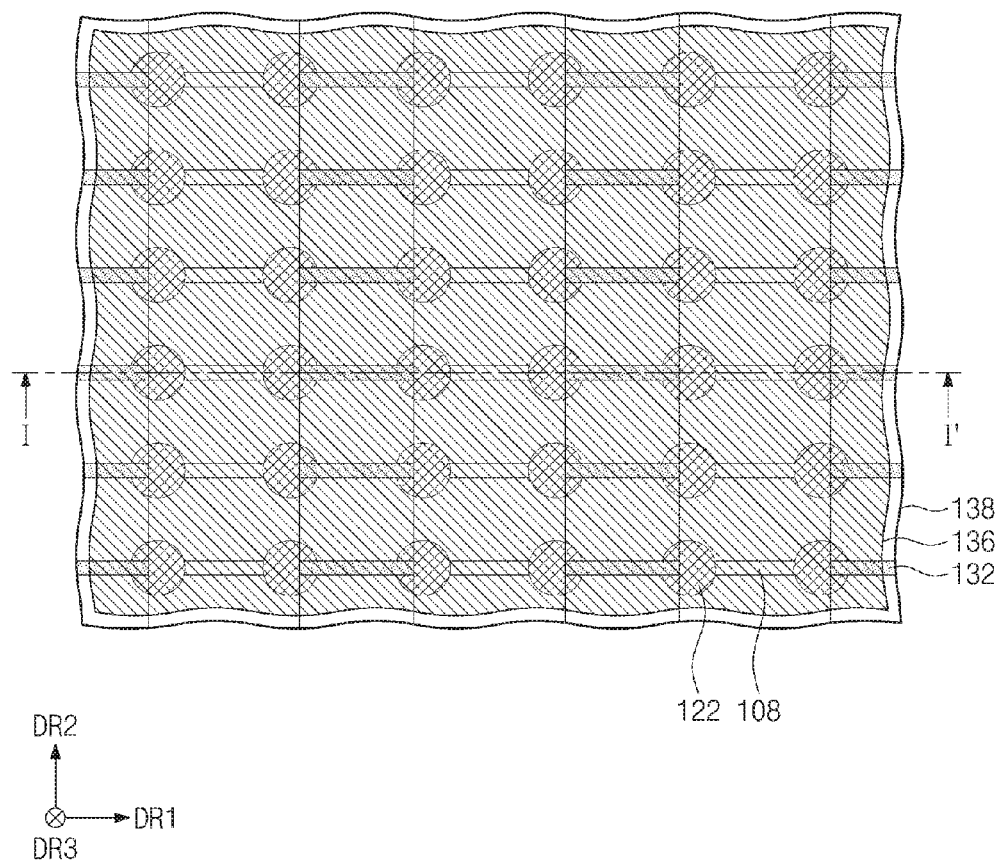
Figure 6B:
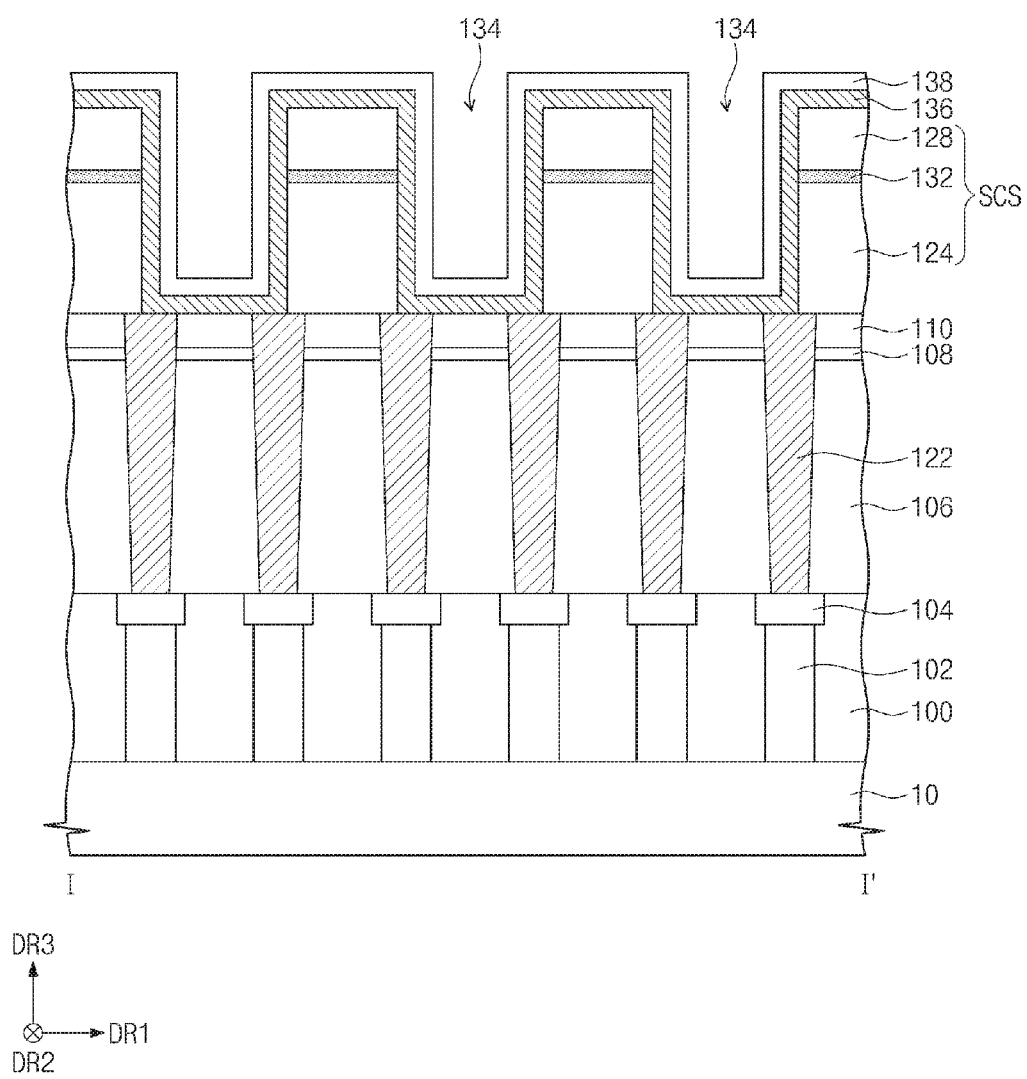

Referring to FIGS. 6A and 6B, a second conductive layer 136 may be conformally formed on the sacrificial structures SCS. The second conductive layer 136 may not completely fill each of the openings 134. The second conductive layer 136 may include at least one of doped poly-silicon, tungsten, titanium, tantalum, tungsten nitride, titanium nitride, or tantalum nitride.

Subsequently, a spacer layer 138 may be conformally formed on the second conductive layer 136. The spacer layer 138 may not completely fill each of the openings 134. The spacer layer 138 may include a nitride layer or an oxynitride layer.

Referring to FIGS. 7A to 7D, the spacer layer 138 and the second conductive layer 136 may be etched to form a second conductive pattern 142 and a spacer 140 on each of sidewalls of the sacrificial structures SCS.

Figure 7A:
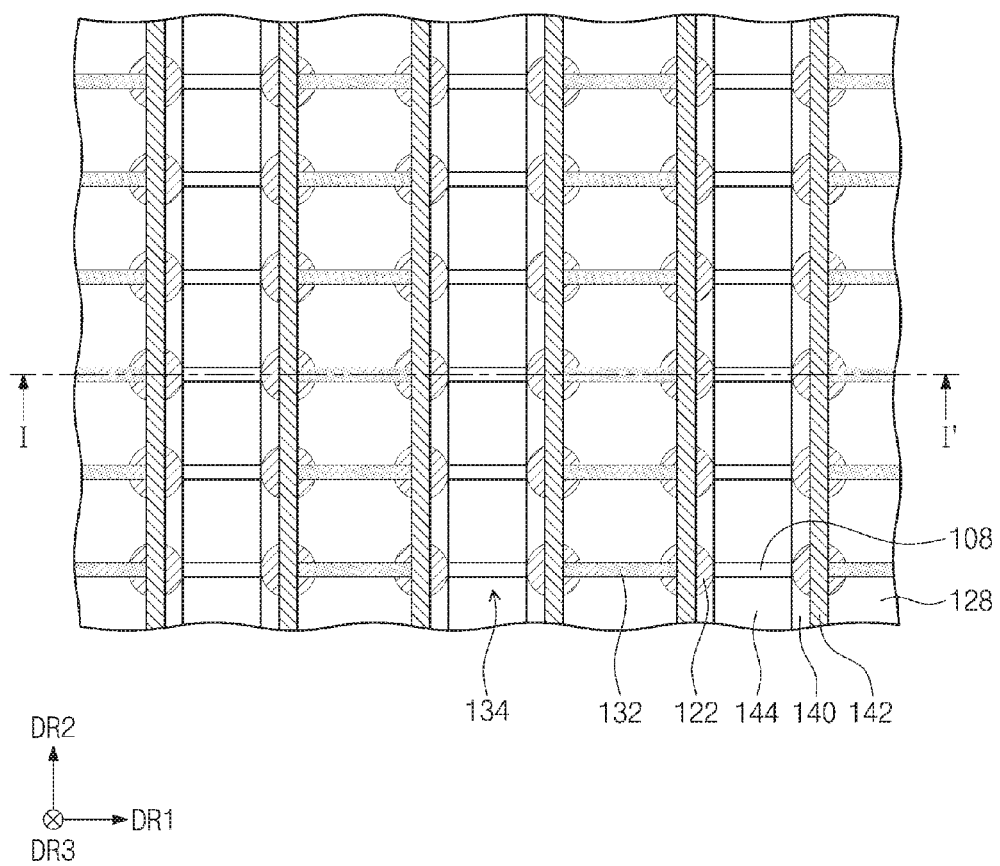
Figure 7B:
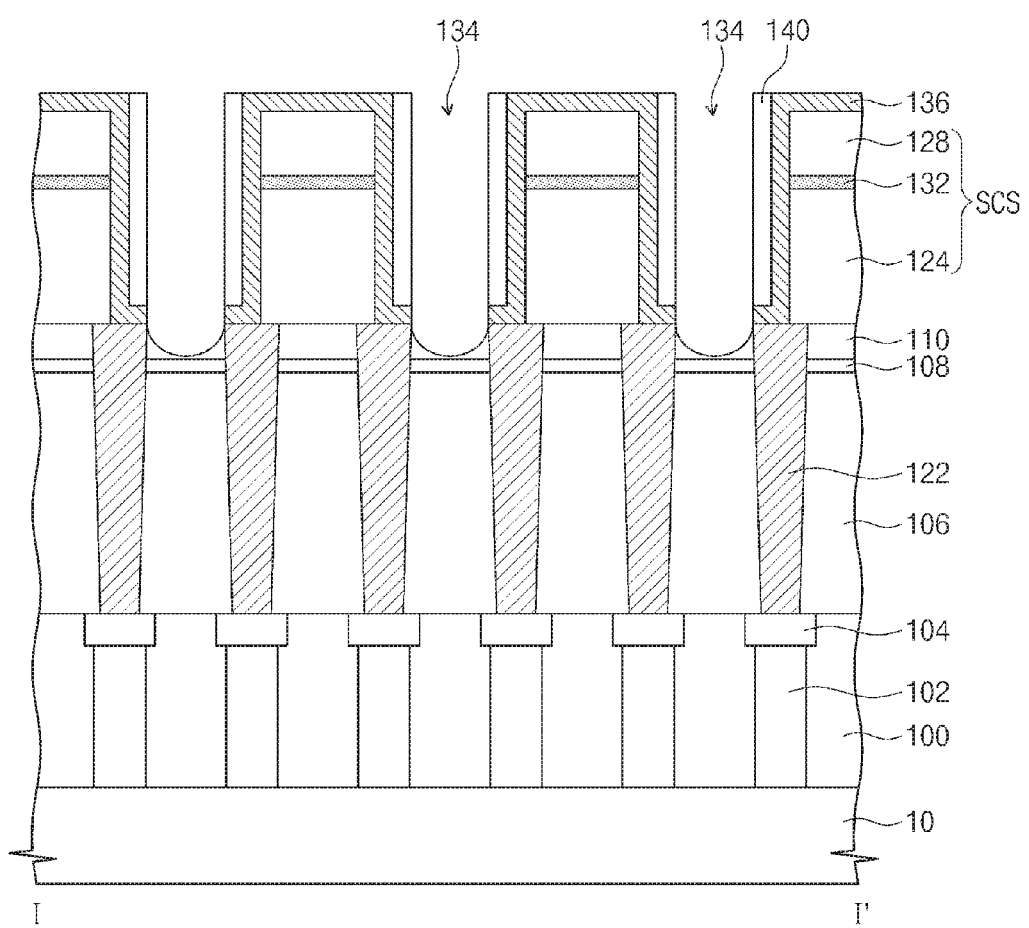
FIGS. 7B to 7D are cross-sectional views illustrating a method of forming a semiconductor device of FIG. 7A.
Figure 7C:
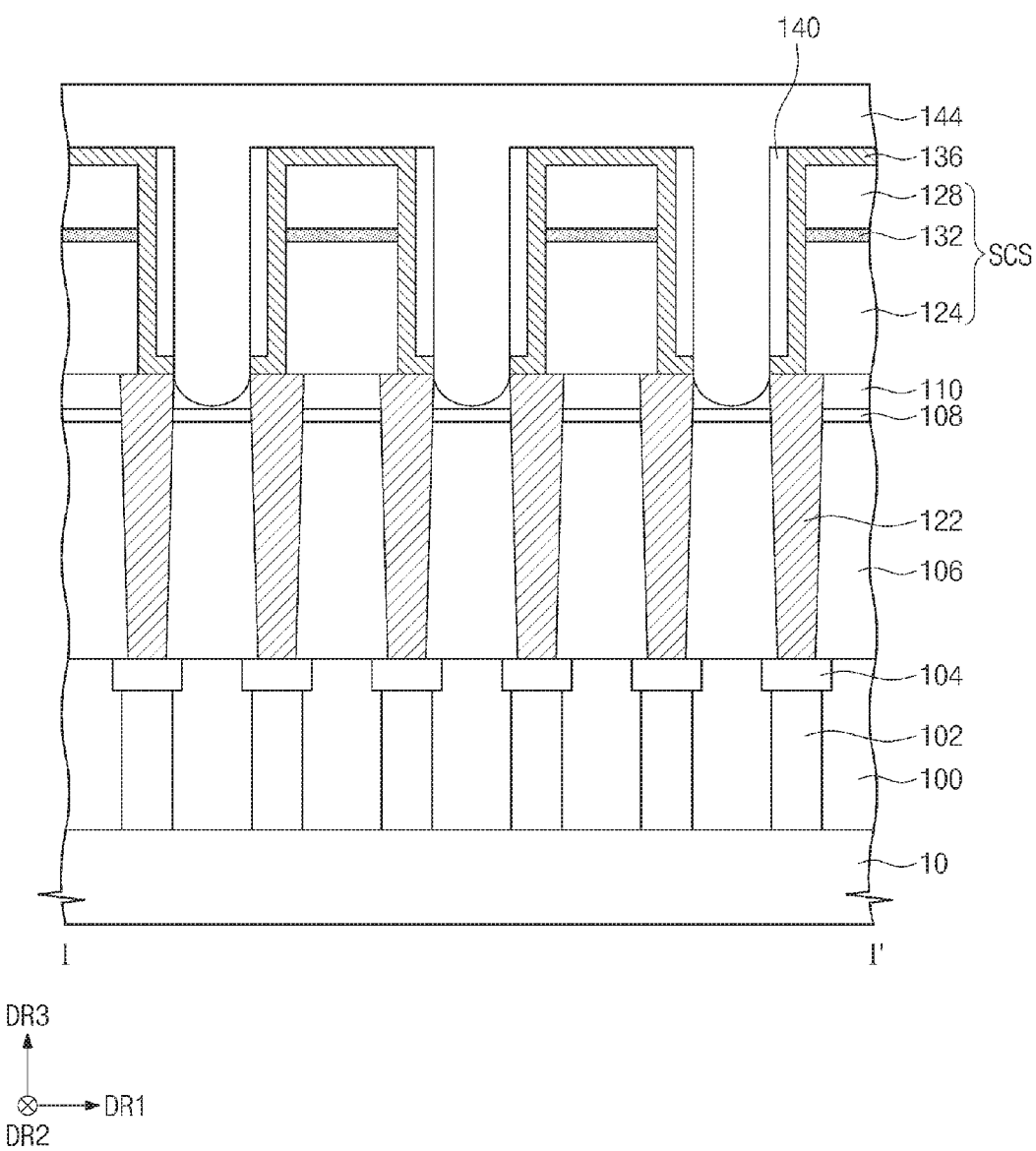
Figure 7D:
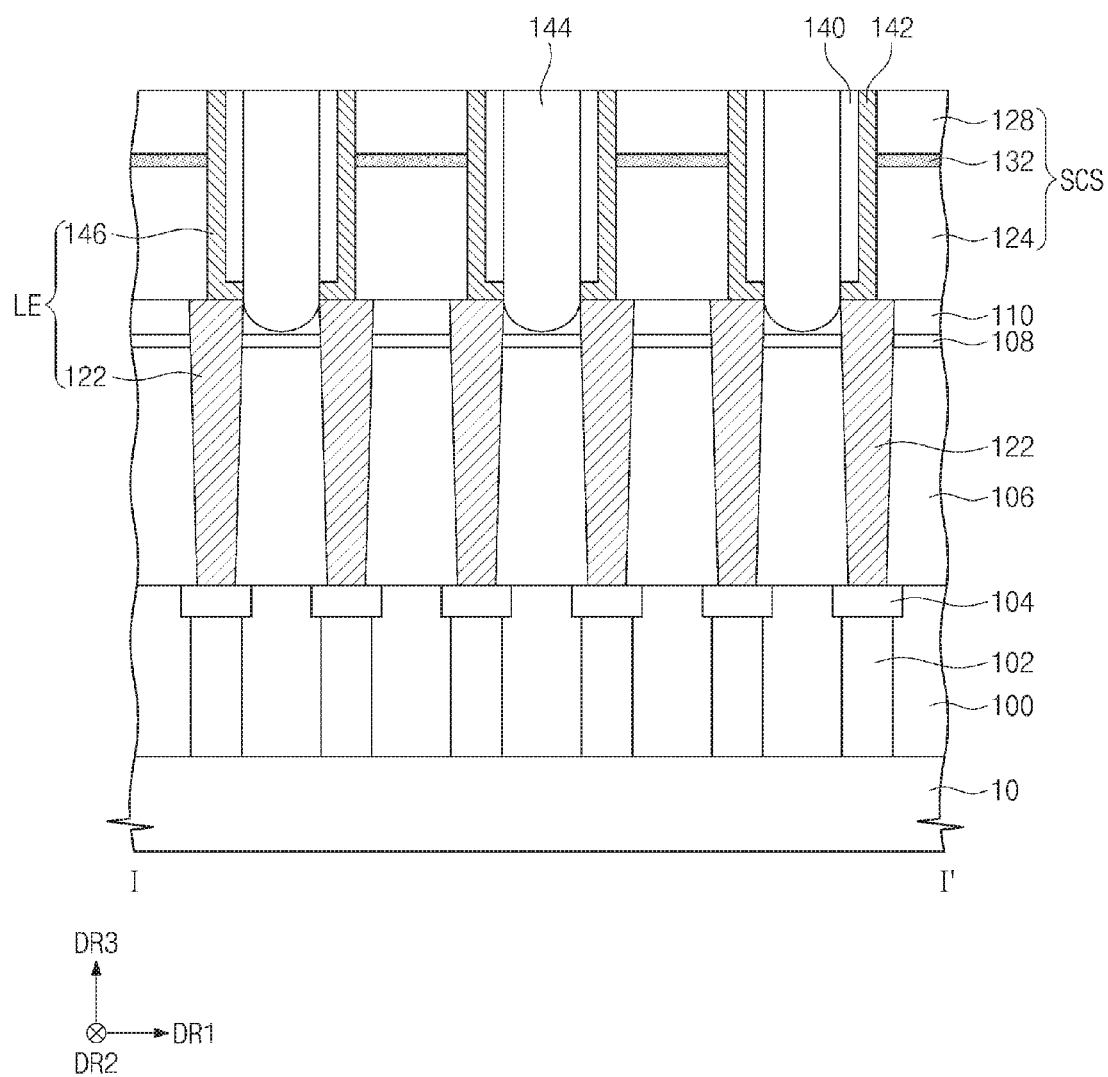

In some example embodiments, an anisotropic etching process may be performed on the spacer layer 138 and the second conductive layer 136 to remove the spacer layer 138 and the second conductive layer 136 formed on bottom surfaces of the openings 134 and the spacer layer 138 on top surfaces of the sacrificial structures SCS. However, as illustrated in FIG. 7B, a portion of the second conductive layer 136 may remain on the top surfaces of the sacrificial structures SCS. Meanwhile, an exposed top surface of the second sacrificial layer 110 may be etched by over-etching, and thus the second sacrificial layer 110 may have a top surface that is recessed downward. As illustrated in FIG. 7C, a fifth sacrificial layer 144 may be formed to fill the openings 134. The fifth sacrificial layer 144 may include the same material as the first, second, third, and fourth sacrificial layers 106, 110, 124, and 128. For example, the fifth sacrificial layer 144 may include at least one of a SOH material, a photoresist, an oxide, a nitride, or an oxynitride. Next, the fifth sacrificial layer 144 and the remaining second conductive layer 136 may be planarized until the top surfaces of the sacrificial structures SCS are exposed. Thus, the second conductive patterns 142 and the spacers 140 may be formed on the sidewalls of the sacrificial structures SCS. Each of the second conductive patterns 142 may have a linear shape extending in the second direction DR2. It will be understood that the second conductive patterns 142 may have a linear shape, or a substantially linear shape, to account for manufacturing tolerances. Each of the second conductive patterns 142 may be electrically connected to the first electrodes 122 arranged in the second direction DR2.

Figure 8A:
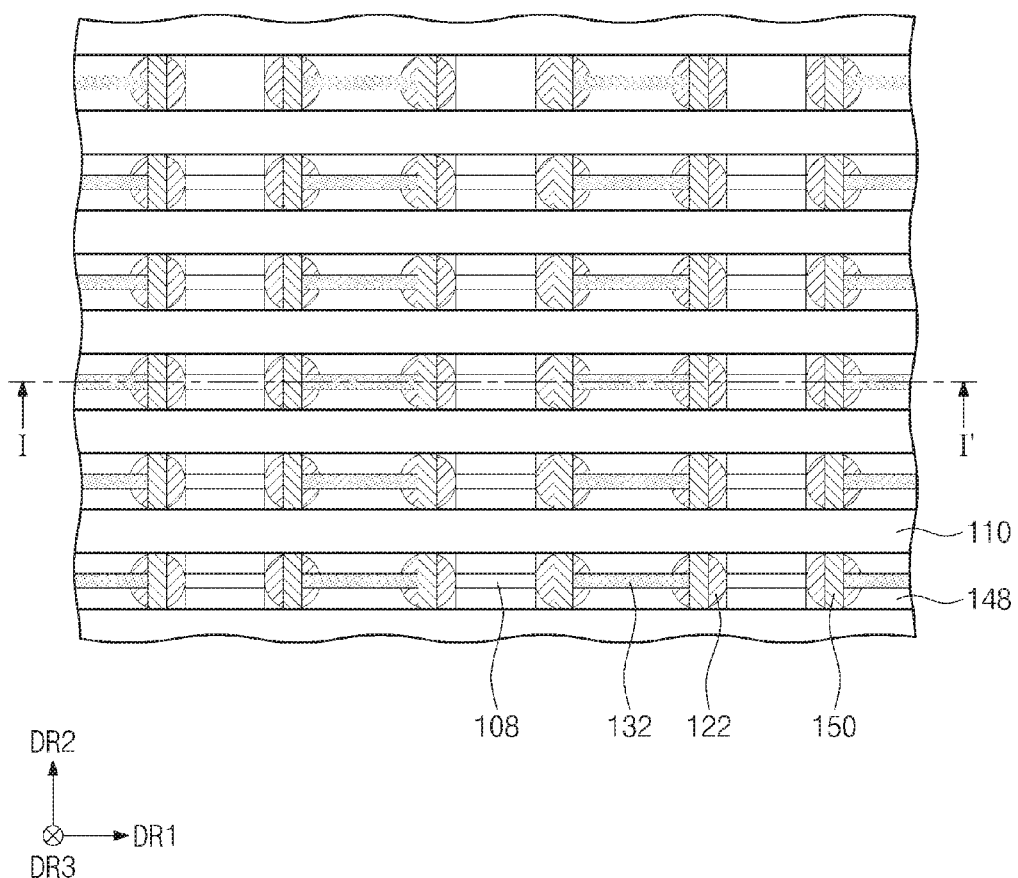
Figure 8B:
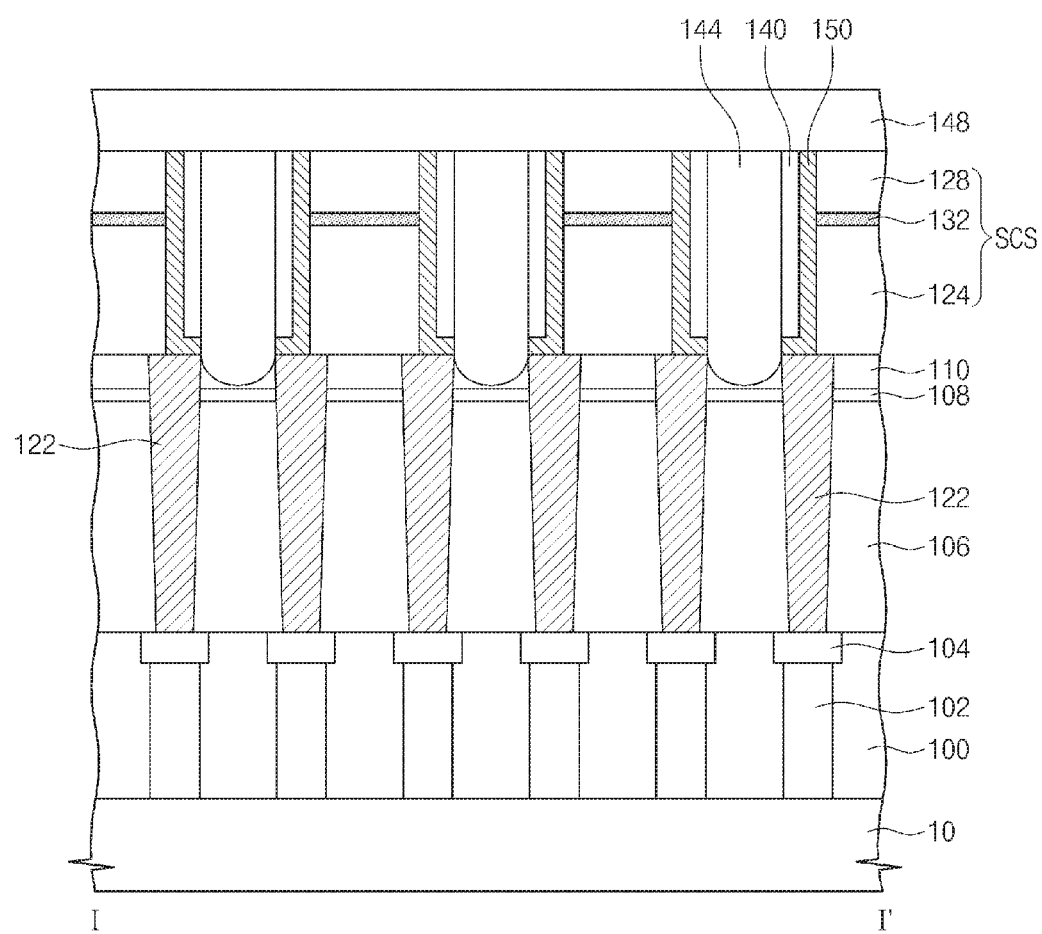

Referring to FIGS. 8A and 8B, the second conductive patterns 142 may be patterned to form second electrodes 150 that are in electrical contact with the first electrodes 122, respectively.

In some example embodiments, second mask patterns 148 may be formed on the sacrificial structures SCS, the second conductive patterns 142, the spacers 140, and the fifth sacrificial layer 144. Each of the second mask patterns 148 may extend in the first direction DR1 and may cover the first electrodes 122 arranged in the first direction DR1.

The second conductive patterns 142, the spacers 140, and the fifth sacrificial layer 144 may be etched using the second mask patterns 148 as etch masks. Thus, the second electrodes 150 may be formed. Each of the second electrodes 150 may have a bar-type cross section of which a longitudinal axis is parallel to the second direction DR2. The second electrodes 150 may be in electrical contact with the top surfaces of the first electrodes 122, respectively. Thus, a lower electrode LE including the first electrode 122 and the second electrode 150 may be formed.

The second mask patterns 148 may be removed after the formation of the second electrodes 150.

Figure 9A:
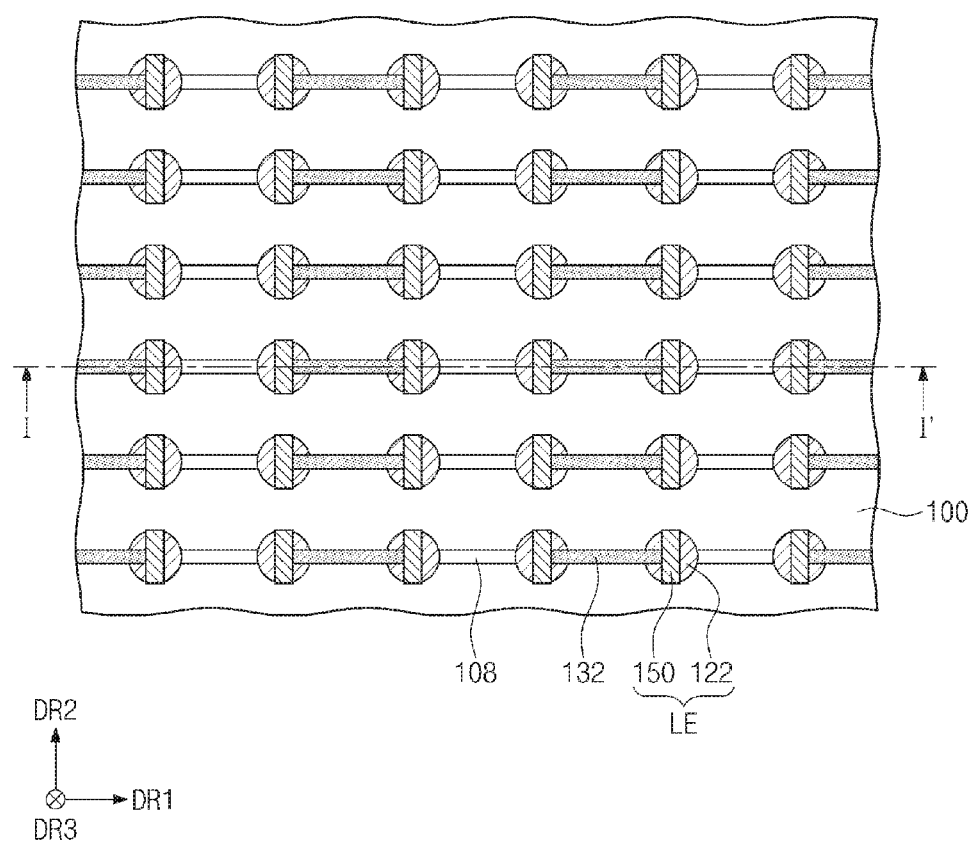
Figure 9B:
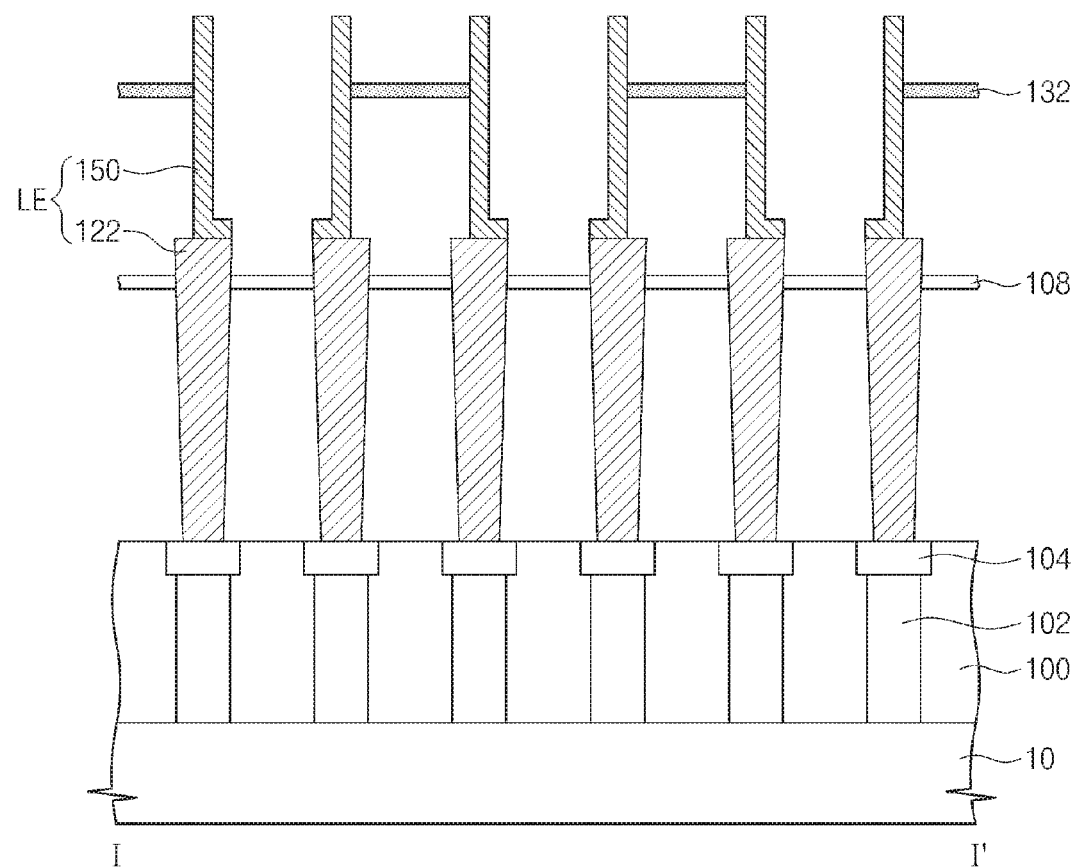

Referring to FIGS. 9A and 9B, the first to fifth sacrificial layers 106, 110, 124, 128, and 144 may be removed to expose the sidewalls and the top surfaces of the first electrodes 122 and sidewalls and top surfaces of the second electrodes 150. In addition, the first support patterns 108 between the first electrodes 122 and the second support patterns 132 between the second electrodes 150 may also be exposed.

In some example embodiments, the first to fifth sacrificial layers 106, 110, 124, 128, and 144 may include the same material. Here, the first to fifth sacrificial layers 106, 110, 124, 128, and 144 may include a material having an etch selectivity with respect to the first and second support patterns 108 and 132, the first and second electrodes 122 and 150, and the interlayer insulating layer 100 in an etching process using an etchant. Thus, the first and second support patterns 108 and 132, the first and second electrodes 122 and 150, and the interlayer insulating layer 100 may not be substantially etched during the removal of the first to fifth sacrificial layers 106, 110, 124, 128, and 144.

Figure 10A:
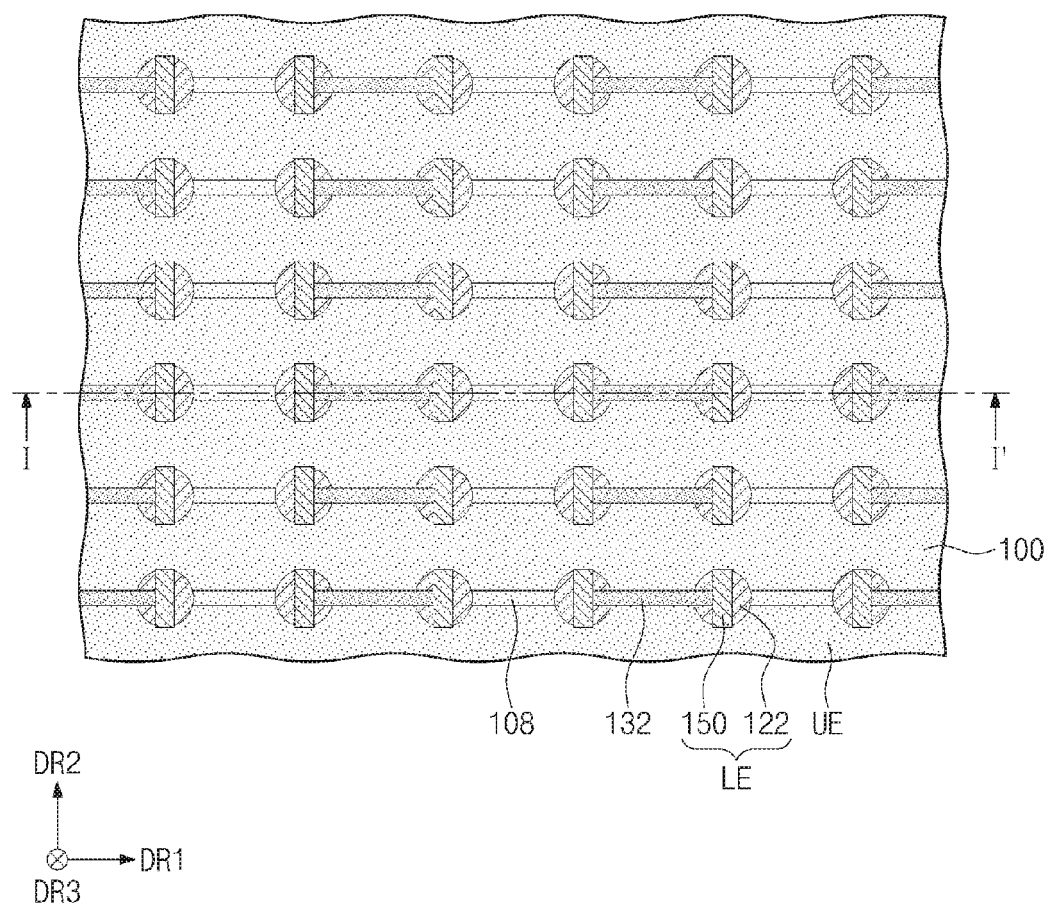
Figure 10B:
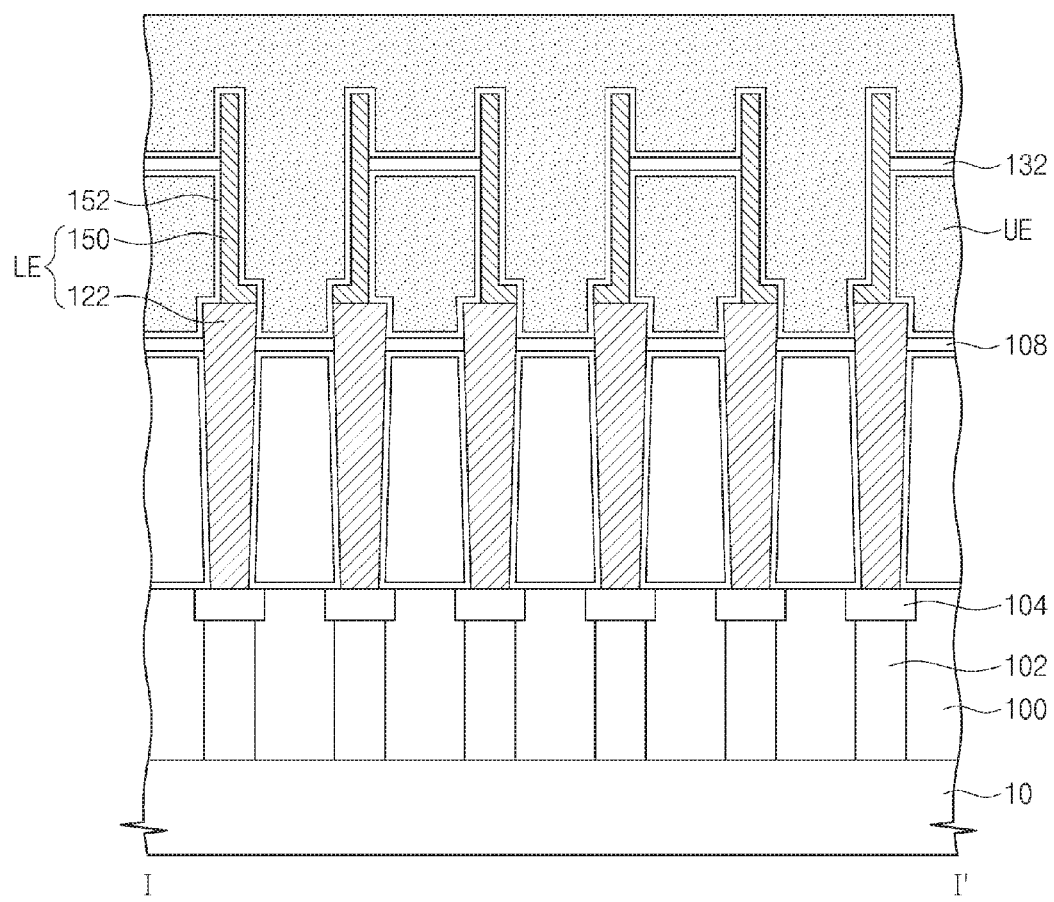

Referring to FIGS. 10A and 10B, a dielectric layer 152 may be conformally formed on the exposed surfaces of the lower electrodes LE and the first and second support patterns 108 and 132. The dielectric layer 152 may include a metal oxide of which a dielectric constant is higher than the dielectric constant of silicon oxide. For example, the metal oxide may include at least one of $HfO_2$, $ZrO_2$, $Ta_2O_5$, $TiO_2$, or $Y_2O_3$.

An upper electrode UE may be formed on the dielectric layer 152 to cover the lower electrodes LE, the first support patterns 108, and the second support patterns 132. The upper electrode UE may include at least one of doped poly-silicon, tungsten, titanium, tantalum, tungsten nitride, titanium nitride, or tantalum nitride.

FIGS. 11A to 11D are plan views illustrating a method of manufacturing a semiconductor device, according to some example embodiments of the inventive concepts.

Figure 11A:
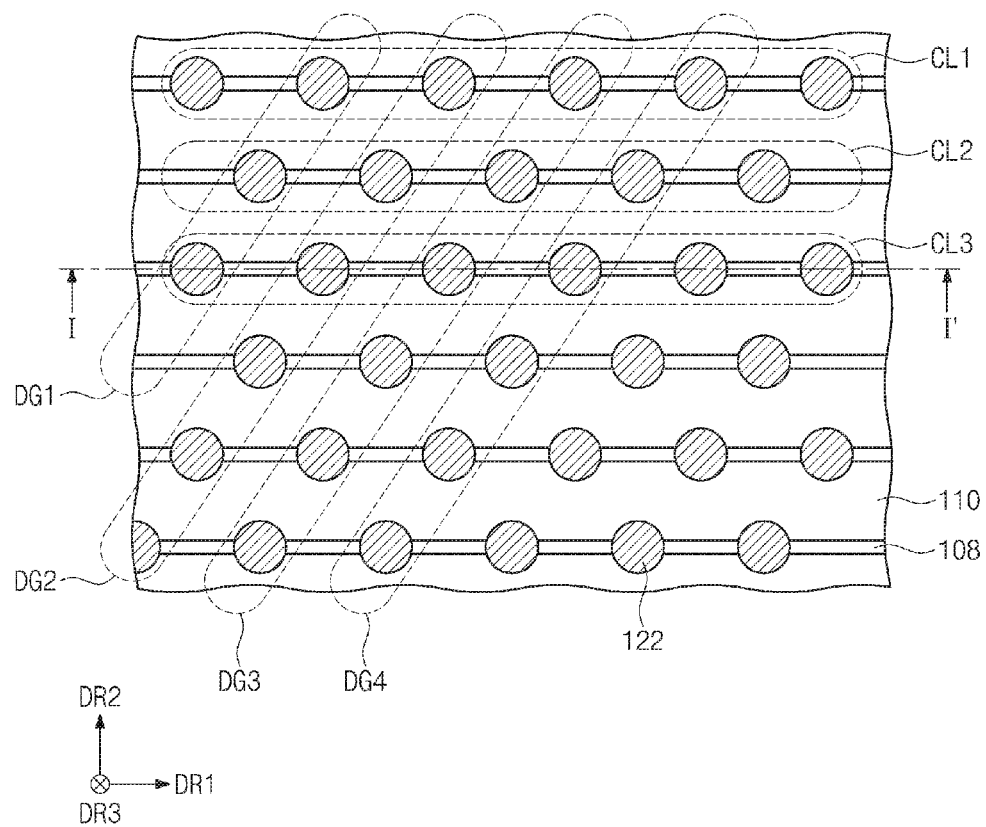
FIGS. 11A to 11D are plan views illustrating a method of manufacturing a semiconductor device, according to some example embodiments of the inventive concepts.

Referring to FIGS. 11A and 3B, the lower structure may be formed on the substrate 10, and the first electrodes 122 and the first support patterns 108 may be formed on the lower structure. The first electrodes 122 may be electrically connected to the lower structure. In some example embodiments, the first sacrificial layer 106, the first support patterns 108, and the second sacrificial layer 110 may be formed, for example sequentially formed, on the interlayer insulating layer 100 of the lower structure. The second sacrificial layer 110, the first support patterns 108, and the first sacrificial layer 106 may be patterned to form first holes exposing the contact pads 104, respectively. The first electrodes 122 may be formed to fill the first holes, respectively.

Referring to FIG. 11A, the first electrodes 122 may be spaced apart from each other and may be two-dimensionally arranged in a plan view. The first electrodes 122 may constitute a plurality of row groups parallel to the first direction DR1. Each of the row groups may include the first electrodes 122 arranged in the first direction DR1. The row groups may include a first row group CL1, a second row group CL2, and a third row group CL3. The first electrodes 122 of the first row group CL1 may be aligned with the first electrodes 122 of the third row group CL3 in the second direction DR2, respectively. Thus, the first electrodes 122 of the first and third row groups CL1 and CL3 may constitute a plurality of columns parallel to the second direction DR2. At this time, the first electrodes 122 of the second row group CL2 may be laterally offset from the columns of the first electrodes 122 of the first and third row groups CL1 and CL3, respectively. In addition, the first electrodes 122 may constitute a first diagonal group DG1, a second diagonal group DG2, a third diagonal group DG3, and a fourth diagonal group DG4, each of which includes the first electrodes 122 arranged in a direction non-parallel and non-perpendicular to the first and second directions DR1 and DR2.

Figure 11B:
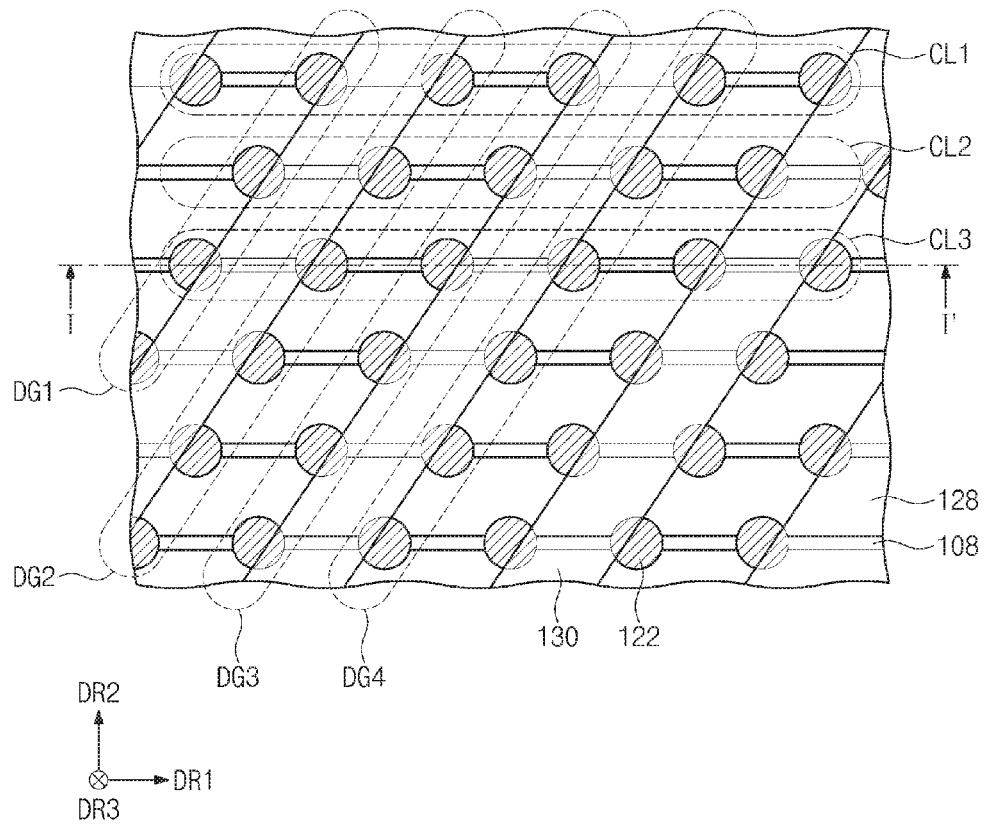

Referring to FIGS. 11B and 4B, the third sacrificial layer 124, the second support layer 126, and the fourth sacrificial layer 128 may be formed, for example sequentially formed, on the second sacrificial layer 110 and the first electrodes 122.

Next, first mask patterns 130 may be formed on the fourth sacrificial layer 128. At this time, unlike those illustrated in FIG. 4B, the first mask patterns 130 may extend in the direction non-parallel and non-perpendicular to the first and second directions DR1 and DR2. In some example embodiments, one of the first mask patterns 130 may cover at least portions of the first electrodes 122 of the first diagonal group DG1 and at least portions of the first electrodes 122 of the second diagonal group DG2. Another one of the first mask patterns 130 may cover at least portions of the first electrodes 122 of the third diagonal group DG3 and at least portions of the first electrodes 122 of the fourth diagonal group DG4.

The fourth sacrificial layer 128, the second support layer 126, and the third sacrificial layer 124 may be etched using the first mask patterns 130 as etch masks to form sacrificial structures. At this time, the second support layer 126 may be etched to form second support patterns 132. A second conductive pattern and a spacer may be formed on each of, or on at least one of, the sidewalls of the sacrificial structures. The sacrificial structures, the second conductive patterns, and the spacers may be formed by the same or similar method as described with reference to FIGS. 5A to 7A and 5B to 7B.

Figure 11C:
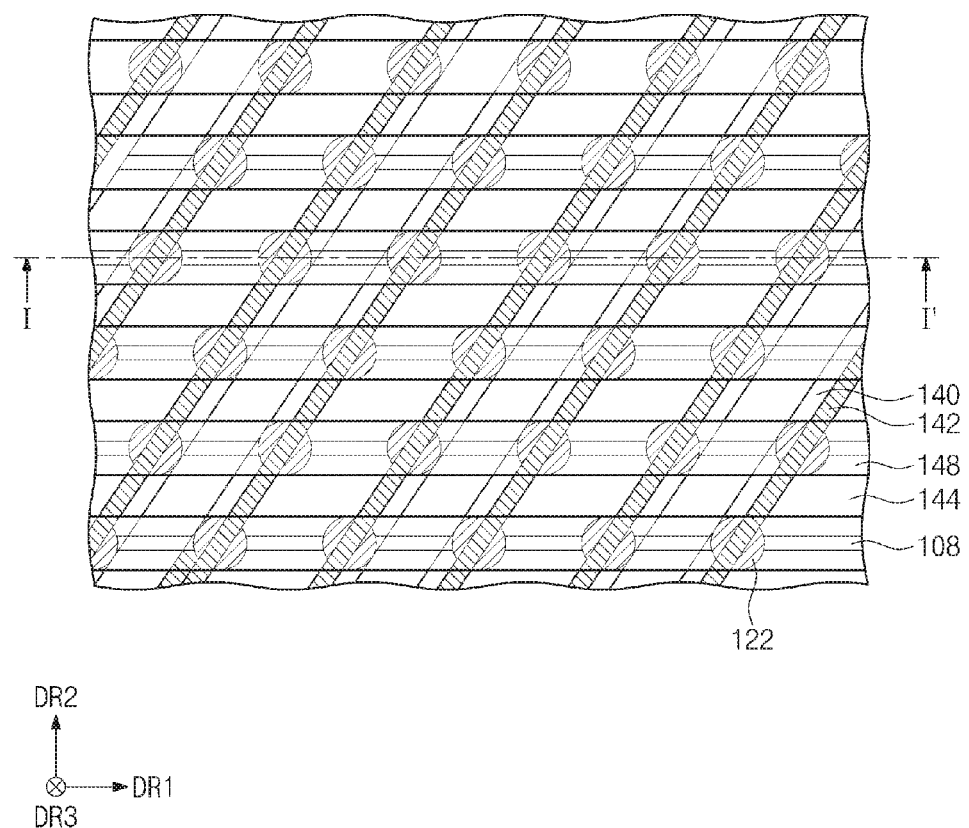

Referring to FIGS. 11C and 8B, second mask patterns 148 may be formed on the sacrificial structures SCS, the second conductive patterns 142, the spacers 140, and the fifth sacrificial layer 144. Each of the second mask patterns 148 may extend in the first direction DR1 and may cover the first electrodes 122 arranged in the first direction DR1.

The second conductive patterns 142, the spacers 140, and the fifth sacrificial layer 144 may be etched using the second mask patterns 148 as etch masks. Thus, the second electrodes 150 may be formed. Each of the second electrodes 150 may have a bar-type cross section of which a longitudinal axis is parallel to the direction non-parallel and non-perpendicular to the first and second directions DR1 and DR2.

Figure 11D:
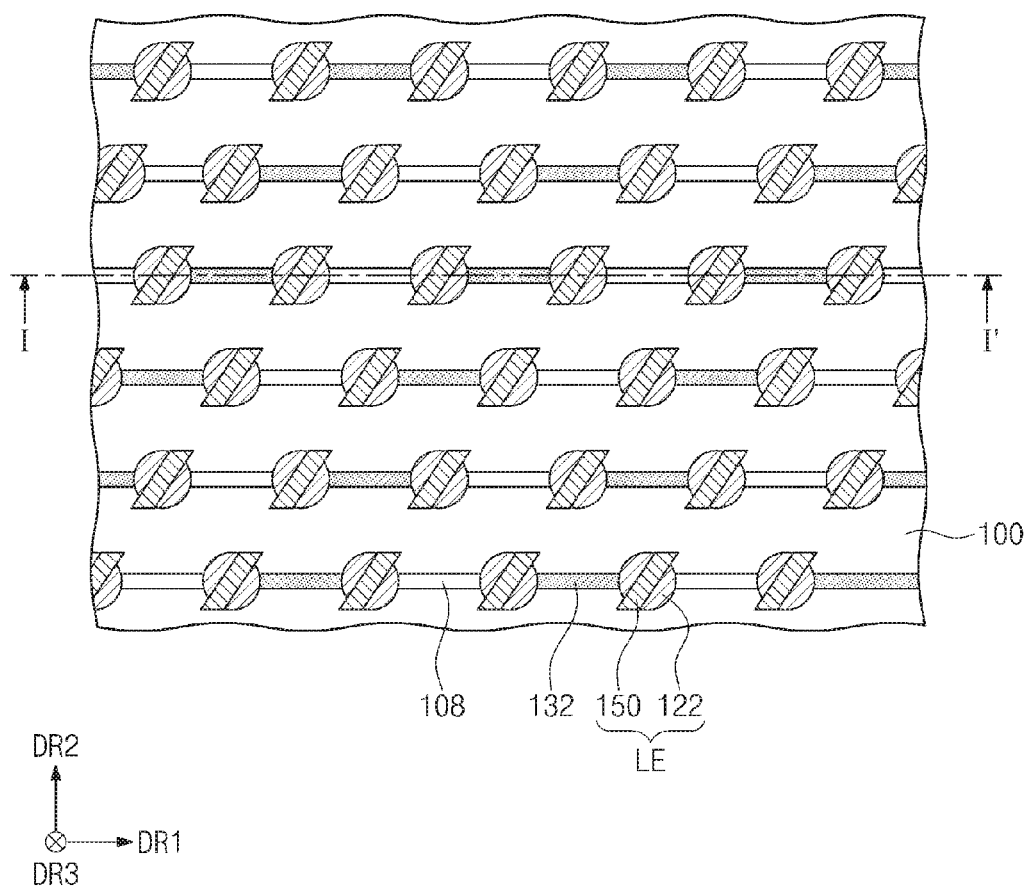

Referring to FIGS. 11D and 9B, the first to fifth sacrificial layers 106, 110, 124, 128, and 144 may be removed to expose the sidewalls and the top surfaces of the first electrodes 122 and the sidewalls and the top surfaces of the second electrodes 150. In addition, the first support patterns 108 between the first electrodes 122 and the second support patterns 132 between the second electrodes 150 may also be exposed.

Thereafter, the dielectric layer 152 and the upper electrode UE may be formed as described with reference to FIGS. 10A and 10B.

According to some example embodiments of the inventive concepts, since the lower electrode has a multi-layered structure, problems caused by a high aspect ratio may be minimized or prevented. In addition, the second electrode of the lower electrode may have the pillar shape having the bar-type cross section, and the width of the second electrode may be smaller than the width of the first electrode of the lower electrode. Thus, a bridge phenomenon between the lower electrodes may be prevented.

While the inventive concepts have been described with reference to some example embodiments, it will be apparent to those skilled in the art that various changes and modifications may be made without departing from the spirits and scopes of the inventive concepts. Therefore, it should be understood that the above example embodiments are not limiting, but illustrative. Thus, the scopes of the inventive concepts are to be determined by the broadest permissible interpretation of the following claims and their equivalents, and shall not be restricted or limited by the foregoing description.

What is claimed is:

1. A semiconductor device comprising:
   lower electrodes on a substrate, each of the lower electrodes including a first electrode and a second electrode stacked in a first direction;
   a dielectric layer on the lower electrodes;
   an upper electrode on the dielectric layer, and
   a first support pattern on a side surface of the first electrode,
   wherein the second electrode of the each of the lower electrodes has a pillar structure with a bar-type cross section and a longitudinal axis when viewed from a cross-sectional view taken along a plane defined by second and third directions perpendicular to the first direction; and
   wherein the second electrodes of the lower electrodes are electrically insulated from each other.

2. The semiconductor device of claim 1, wherein the longitudinal axis of the second electrode is parallel to the second direction.

3. The semiconductor device of claim 1, wherein the longitudinal axis of the second electrode is parallel to a direction that is non-parallel and non-perpendicular to the second and third directions.

4. The semiconductor device of claim 1, wherein the second electrode has an L-shaped structure when viewed from a cross-sectional view taken along the first direction.

5. The semiconductor device of claim 1, wherein the first electrode has a cylindrical shape.

6. The semiconductor device of claim 1, wherein the first electrode has a pillar structure that has a bar-type cross section having a longitudinal axis perpendicular to the longitudinal axis of the second electrode.

7. The semiconductor device of claim 1, wherein the first electrode has a hollow cylindrical shape of which a bottom end is closed.

8. The semiconductor device of claim 1, wherein the lower electrodes are spaced apart from each other and constitute first and second groups,
wherein each of the first and second groups includes the lower electrodes arranged in the second direction,
wherein the first and second groups are spaced apart from each other in the third direction, and
wherein the lower electrodes of the first group are aligned with the lower electrodes of the second group in the third direction, respectively.

9. The semiconductor device of claim 1, wherein the lower electrodes are spaced apart from each other and include first, second, and third groups,
wherein each of the first, second, and third groups includes the lower electrodes arranged in the second direction,
wherein the first, second, and third groups are spaced apart from each other in the third direction,
wherein the lower electrodes of the first group are respectively aligned with the lower electrodes of the third group in the third direction such that the lower electrodes of the first and third groups include columns parallel to the third direction, and
wherein the lower electrodes of the second group are laterally offset from the columns of the first and third groups, respectively.

10. The semiconductor device of claim 1, further comprising:
second support patterns between the second electrodes;
wherein the first support pattern includes a plurality of first support patterns, the plurality of first support patterns being between the first electrodes of the lower electrodes.

11. A semiconductor device comprising:
lower electrodes on a substrate, each of the lower electrodes having a pillar structure with a bar-type cross section having a longitudinal axis;
a dielectric layer on the lower electrodes; and
an upper electrode on the dielectric layer;
wherein each of the lower electrodes has an L-shaped structure when viewed from a cross-sectional view taken along a direction perpendicular to the bar-type cross-section; and
wherein the lower electrodes are electrically insulated from each other.

12. The semiconductor device of claim 11, wherein a direction perpendicular to a top surface of the substrate is a first direction,
wherein second and third directions are perpendicular to the first direction, and
wherein the longitudinal axis of each of the lower electrodes is parallel to the second direction when viewed from a cross-sectional view taken along a plane defined by the second and third directions.

13. The semiconductor device of claim 11, wherein a direction perpendicular to a top surface of the substrate is a first direction,
wherein second and third directions are perpendicular to the first direction, and
wherein the longitudinal axis of each of the lower electrodes is parallel to a direction that is non-parallel and non-perpendicular to the second and third directions when viewed from a cross-sectional view taken along a plane defined by the second and third directions.

14. The semiconductor device of claim 11, further comprising:
support patterns between the lower electrodes.

15. A semiconductor device comprising:
at least one stacked structure, the stacked structure including a first electrode stacked on a second electrode on a substrate, the first and second electrodes having a longitudinal portion and a transverse portion, the longitudinal portion being smaller than the transverse portion;
a support pattern on a side surface of the second electrode;
a dielectric layer on the first and second electrodes; and
an upper electrode on the dielectric layer;
wherein the first electrode has a pillar structure with a bar-type cross section having a longitudinal axis;
wherein the first and second electrodes respectively include a plurality of first electrodes and a plurality of second electrodes; and
wherein the plurality of first electrodes are electrically insulated from each other.

16. The semiconductor device of claim 15, wherein the dielectric layer is conformally arranged on at least one of the first and second electrodes.

17. The semiconductor device of claim 15, wherein one of the first and second electrodes has a pillar structure and another of the first and second electrodes has a column structure.

18. The semiconductor device of claim 15, wherein:
at least one of the plurality of first electrodes and the plurality of second electrodes are in alignment in a longitudinal direction of the substrate.

19. The semiconductor device of claim 18, wherein the support pattern is parallel to the longitudinal direction of the substrate.

* * * * *